United States Patent
Arai et al.

(10) Patent No.: US 10,510,939 B2
(45) Date of Patent: Dec. 17, 2019

(54) THERMOELECTRIC CONVERSION CELL AND THERMOELECTRIC CONVERSION MODULE

(71) Applicant: MITSUBISHI MATERIALS CORPORATION, Tokyo (JP)

(72) Inventors: Koya Arai, Saitama (JP); Masahito Komasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/079,614

(22) PCT Filed: Feb. 21, 2017

(86) PCT No.: PCT/JP2017/006275
§ 371 (c)(1),
(2) Date: Aug. 24, 2018

(87) PCT Pub. No.: WO2017/146014
PCT Pub. Date: Aug. 31, 2017

(65) Prior Publication Data
US 2019/0019933 A1    Jan. 17, 2019

(30) Foreign Application Priority Data

Feb. 24, 2016 (JP) ................................ 2016-032695
Feb. 17, 2017 (JP) ................................ 2017-027771

(51) Int. Cl.
*H01L 35/06* (2006.01)
*H01L 35/32* (2006.01)

(52) U.S. Cl.
CPC .............. *H01L 35/06* (2013.01); *H01L 35/32* (2013.01)

(58) Field of Classification Search
CPC ................................ H01L 35/06; H01L 35/32
(Continued)

(56) References Cited

U.S. PATENT DOCUMENTS 2,906,801 A    9/1959  Fritts
3,522,106 A    7/1970  Debiesse et al.
(Continued)

FOREIGN PATENT DOCUMENTS

JP    08-306968 A    11/1996
JP    10-144970 A     5/1998
(Continued)

OTHER PUBLICATIONS

International Search Report dated May 9, 2017, issued for PCT/JP2017/006275.
(Continued)

*Primary Examiner* — Eli S Mekhlin
*Assistant Examiner* — Dujuan A Horton
(74) *Attorney, Agent, or Firm* — Locke Lord LLP

(57) ABSTRACT

A thermoelectric conversion cell is provided with: an insulating member having a through hole, a female threaded portions (insulation-side threaded portion) at both end parts, respectively, of the through hole in the through-direction; a thermoelectric conversion member which has a thermoelectric conversion element (P-type thermoelectric conversion element), and is accommodated within the through hole; and electrode members coupled at the end parts, respectively, of the insulating member, and which have male threaded portions (electrode-side threaded portion) corresponding to the female threaded portions, and electrode parts electrically connected to the end part of the thermoelectric conversion member inside the through hole.

10 Claims, 24 Drawing Sheets

(58) Field of Classification Search
USPC .................................................. 136/200–242
See application file for complete search history.

(56) References Cited

U.S. PATENT DOCUMENTS

2015/0372215 A1\* 12/2015 Miyagawa .............. H01L 35/34
136/205
2016/0254432 A1   9/2016 Yoshimi

FOREIGN PATENT DOCUMENTS

| JP | 11-261118 A   | 9/1999  |
| JP | 2005-317629 A | 11/2005 |
| JP | 2011-134940 A | 7/2011  |
| JP | 2015-032747 A | 2/2015  |
| JP | 2015-088577 A | 5/2015  |

OTHER PUBLICATIONS

Supplementary European Search Report dated Aug. 13, 2019, issued for the European patent application No. 17756452.3.

\* cited by examiner

THERMOELECTRIC CONVERSION CELL AND THERMOELECTRIC CONVERSION MODULE

BACKGROUND OF THE INVENTION

Technical Field

The present invention relates to a thermoelectric conversion cell provided with a P-type thermoelectric conversion element or an N-type thermoelectric conversion element and a thermoelectric conversion module using the thermoelectric conversion cell in which a plurality of the P-type thermoelectric conversion elements and the N-type thermoelectric conversion elements are arrayed in series.

Priority is claimed on Japanese Patent Application No. 2016-032695, filed Feb. 24, 2016 and Japanese Patent Application No. 2017-027771, filed Feb. 17, 2017, the content of which is incorporated herein by reference.

Background Art

A thermoelectric conversion module has a structure in which thermoelectric conversion cells in which a pair of a P-type thermoelectric conversion element and an N-type thermoelectric conversion element are coupled to an electrode or coupled directly together in a connected state are electrically connected in series between a couple of wiring substrates (insulating substrates) so that the P-type and N-type thermoelectric conversion elements are alternately arrayed in order of the P-type, N-type, P-type, and N-type. The thermoelectric conversion module moves heat (in a same direction as a current in the P-type or in a counter direction to a current in the N-type) in the thermoelectric conversion elements by the Peltier effect if both ends thereof are connected to a DC power: or the thermoelectric conversion module generates an electromotive force in the thermoelectric conversion elements by the Seebeck effect if temperature difference is given between the wiring substrates: so that the thermoelectric conversion module can be used for cooling, heating or power-generating.

As a thermoelectric conversion cell used for a thermoelectric conversion module, in Patent Document 1 for example, a thermoelectric conversion cell (a thermoelectric conversion element) in which a P-type thermoelectric conversion element (p-type semiconductor element) is filled in one side of a tubular insulating supporter via a partition and an N-type thermoelectric conversion element (n-type semiconductor element) is filled in the other side, and the P-type thermoelectric conversion element and the N-type thermoelectric conversion element are electrically connected at one end, is disclosed. Patent Document 1 also describes that an assembling operation of the thermoelectric conversion module is easy because the thermoelectric conversion cells can be disposed closely by the thermoelectric conversion cells in which the P-type thermoelectric conversion element and the N-type thermoelectric conversion element are disposed inside the tubular insulating supporter.

Patent Document 2 discloses a temperature detection device having a power-generator provided with a thermoelectric conversion element and can continuously perform. In the temperature detection device described in Patent Document 2, the thermoelectric conversion element is stored in a case and and the thermoelectric conversion element is fixed by pressuring between a first heat transferring part and a second heat transferring part. Patent Document 2 also describes that the thermoelectric conversion element is prevented from being damaged by a fixing structure in which a heat connection element having a shock absorbing property is interposed either between the first heat transferring part and the thermoelectric conversion element or between the second heat transferring part and the thermoelectric conversion element.

Patent Document 3 discloses a basic element for thermoelectric conversion configured by bonding a thermoelectric conversion element (semiconductor element material chip) between a pair of metal blocks having threaded holes. Patent Document 3 also describes that a thermoelectric conversion module (thermoelectric conversion element) is configured by fixing the basic element for thermoelectric conversion to a metal segment by a fixing thread: the thermoelectric conversion module is configured from a structure in which the fixing thread is directly embedded in the basic element for thermoelectric conversion.

CITATION LIST

Patent Literature

Patent Document 1: Japanese Unexamined Patent Application, First Publication No. 2011-134940
Patent Document 2: Japanese Unexamined Patent Application, First Publication No. 2015-32747
Patent Document 3: Japanese Unexamined Patent Application, First Publication No. H08-306968

SUMMARY OF INVENTION

Technical Problem

There are many cases in which an insulating substrate is used on either sides or one side of the thermoelectric conversion module. However, this structure has a lot of interfaces between different materials such as thermoelectric conversion material and metal material and the like, so that a manufacturing process is complicated and the interface between the different materials are easy to be peeled off and the thermoelectric conversion material is easy to be broken by difference of thermal expansion and the like. The thermoelectric conversion cell described in Patent Document 1 also has a lot of interfaces between the difference materials, so that breakage by the difference of the thermal expansion is concerned. In a structure in which the P-type thermoelectric conversion element and the N-type thermoelectric conversion element are filled in the tubular insulating supporter as in the thermoelectric conversion cell described in Patent Document 1, manufacturing operation is complicated.

In a fixing structure of the thermoelectric conversion element described in Patent Document 2, breakage of the thermoelectric conversion element is prevented by inserting the heat connection element having the shock absorbing property: however, it is difficult to apply to a structure increased in size by combination of a plurality of thermoelectric conversion elements because many members are used.

In a structure in which the basic element for the thermoelectric conversion in which the couple of metal blocks having the threaded holes are bonded to the thermoelectric conversion element is provided and the the basic element for thermoelectric conversion is fixed by the fixing thread via the metal segment as in the thermoelectric conversion module described in Patent Document 3, because the basic element for thermoelectric conversion in which the metal block and the thermoelectric conversion element are bonded is necessary, output and durability may be deteriorated if it is not material having good bondability between the metal block and the thermoelectric conversion material. In the structure of the basic element for thermoelectric conversion described in Patent Document 3, it is necessary for the thermoelectric conversion element to be thicker enough than a male threaded portion of the fixing thread, so it is difficult to design.

In the thermoelectric conversion module the P-type thermoelectric conversion element and the N-type thermoelectric conversion element of the plurality of thermoelectric conversion cells are alternately connected in series, so that the thermoelectric conversion module is unable to be used including a most part which can normally work if a part of the thermoelectric conversion cells is broken. Moreover, in order to use the thermoelectric conversion module in maximum output, internal resistance of the thermoelectric conversion module and load resistance of an output destination should be the same. Accordingly, it is desirable to change the internal resistance of the thermoelectric conversion module subsequently in accordance with the load resistance at the output destination. However, in the structure in which the thermoelectric conversion cells are connected to each other, a modification and an alteration are not easy, and flexibility of design is restricted.

The present invention is achieved in consideration of the above circumstances, and has an object to prevent breakage owing to the difference of the thermal expansion between the thermoelectric conversion materials, and to provide a thermoelectric conversion cell and a thermoelectric conversion module configured form a simple structure which can be easily replaced.

Solution to Problem

A thermoelectric conversion cell according to the present invention includes an insulating member having at least one through hole, and having insulation-side threaded portions at respective end parts of the through hole in a through-direction; a thermoelectric conversion member having at least one thermoelectric conversion element and enclosed in the through hole; and an electrode member having electrode-side threaded portions corresponding to the insulation-side threaded portions respectively connected to end parts of the insulating member and an electrode part electrically connected to an end part of the thermoelectric conversion member in the through hole.

The thermoelectric conversion cell has a structure in which the insulating member and the electrode member are connected by screwing the insulation-side threaded portion provided at both the end parts of the insulating member and the electrode-side threaded portion provided at the electrode member. Moreover, the the electrode member and the thermoelectric conversion member (the thermoelectric conversion element) are electrically connected by connecting the electrode member with the insulating member so as to hold the thermoelectric conversion member between the electrode parts of the electrode members.

As described above, the thermoelectric conversion member and the electrode members are not bonded, but electrically connected by holding the thermoelectric conversion member between the electrode parts; so that it is possible to prevent breakage of the members owing to difference of thermal expansion between difference materials. Furthermore, the thermoelectric conversion cell is easy to be assembled or disassembled by fastening or loosening the insulation-side threaded portion of the insulating member and the electrode-side threaded portion of the electrode member. Accordingly, the thermoelectric conversion member can be easily replaced even when the thermoelectric conversion member enclosed in the insulating member is broken, or when the thermoelectric conversion member is necessary to be replaced in accordance with design changes.

Moreover, by forming a plurality of through holes on the insulating member and enclosing the thermoelectric conversion members in the respective through holes, it is possible to configure the thermoelectric conversion cell in which a plurality of thermoelectric conversion members are arranged. In this case, a plurality of electrode members are connected to both end parts of the insulating member in accordance with the number of the through holes. By electrically connecting the electrode members adjacently arranged to each other by a connecting member having conductivity, the P-type thermoelectric conversion element and the N-type thermoelectric conversion element of the thermoelectric conversion members enclosed in the through holes can be alternately connected in series, the thermoelectric conversion module can be easily manufactured.

Moreover, by coupling the thermoelectric conversion cells having the same polarity in parallel, inner resistance of the thermoelectric conversion module can be controlled, so that the thermoelectric conversion module suitable to load resistance of output destination can be freely designed. Furthermore, by stacking and connecting the thermoelectric conversion cells enclosing the thermoelectric conversion members having different range of usable temperature in series in a direction of temperature gradient, a segment structure can be formed, so that it is possible to obtain high efficiency of the thermoelectric conversion module.

In the thermoelectric conversion cell according to the present invention, it is desirable that the at least one through hole be one; and out of the insulation-side threaded portions formed at both the end parts of the insulating member, one be a right-hand screw and the other be a left-hand screw.

Forming one of the insulation-side threaded portions formed at both the end parts of the insulating member is a right-hand screw and the other is a left-hand screw, screwing directions are the same between one and the other of the insulation-side threaded portions. Therefore, by rotating the insulating member in the screwing direction, it is possible to connect the insulation-side threaded portions at both the end parts to the electrode threaded portions of the electrode member at once. Moreover, by rotating the insulating member in a direction counter to the screwing direction, it is possible to loosen the insulation-side threaded portions and the electrode-side threaded portions, so that it is possible to detach the electrode members respectively connected to both the end parts of the insulating member at once. Accordingly, it is possible to manufacture the thermoelectric conversion cell and the thermoelectric conversion module easily.

In the thermoelectric conversion cell according to the present invention, a structure below is acceptable: the electrode-side threaded portions are female threaded portions; and the thermoelectric conversion member are formed to be larger than the insulating member in the through-direction of the through hole.

In the thermoelectric conversion cell according to the present invention, it is acceptable to apply a structure in which the electrode-side threaded portions are female threaded portions and the thermoelectric conversion member is formed smaller than the insulating member in the through-direction of the through hole.

In the thermoelectric conversion cell according to the present invention, the thermoelectric conversion member have a structure in which a plurality of the thermoelectric conversion elements each configured from a P-type thermoelectric conversion element or an N-type thermoelectric conversion element be stacked in the through-direction of the through hole, directly or with interposing a conductive member.

The thermoelectric conversion member enclosed in the through hole may be configured from a single P-type thermoelectric conversion element or a single N-type thermoelectric conversion element; or may be configured by stacking a plurality of the P-type thermoelectric conversion elements or the N-type thermoelectric conversion elements. In the thermoelectric conversion cell, the thermoelectric conversion member and the electrode members are electrically connected by holding the thermoelectric conversion member between the electrode parts without bonding the thermoelectric conversion member and the electrode members. Therefore, a plurality of thermoelectric conversion cells can be combined, and the P-type thermoelectric conversion element and the N-type thermoelectric conversion element made of different materials can be combined, so that there are many choices of materials, it is possible to configure the stable thermoelectric conversion module having even properties.

A thermoelectric conversion module according to the present invention includes a plurality of the thermoelectric conversion cells, in which the thermoelectric conversion cells have a first thermoelectric conversion cell wherein the thermoelectric conversion element is formed from a P-type thermoelectric conversion element and a second thermoelectric conversion cell wherein the thermoelectric conversion element is formed from an N-type thermoelectric conversion element; and the first thermoelectric conversion cell and the second thermoelectric conversion cell are alternately connected in series.

In the thermoelectric conversion module according to the present invention, the first thermoelectric conversion cell and the second thermoelectric conversion cell may have a structure of being connected by a connecting member having conductivity.

In the thermoelectric conversion module according to the present invention, a structure further including a connected-type electrode member in which the electrode member of the first thermoelectric conversion cell and the electrode member of the second thermoelectric conversion cell are integrally formed, in which the first thermoelectric conversion cell and the second thermoelectric conversion cell are connected by the connected-type electrode member is applicable.

In the thermoelectric conversion module according to the present invention, it is acceptable to apply a structure in which the first thermoelectric conversion cell and the second thermoelectric conversion cell are alternately stacked in the through-direction, a high-temperature side fin is connected to the electrode member connected to one of the end parts of the thermoelectric conversion cell, and a low-temperature side fin is connected to the electrode member connected to the other of the end parts of the thermoelectric conversion cell.

In the thermoelectric conversion module according to the present invention, the high-temperature side fin and the low-temperature side fin may be formed integrally with the electrode member.

Advantageous Effects of Invention

According to the present invention, it is possible to prevent the breakage of the thermoelectric conversion member owing to the difference of the thermal expansion between the thermoelectric conversion materials, and also it is possible to easily replace the thermoelectric conversion member in the thermoelectric conversion module even when the breakage of the thermoelectric conversion member is occurred.

DESCRIPTION OF EMBODIMENTS

Below, embodiments of the present invention will be explained referring drawings.

Figure 3:
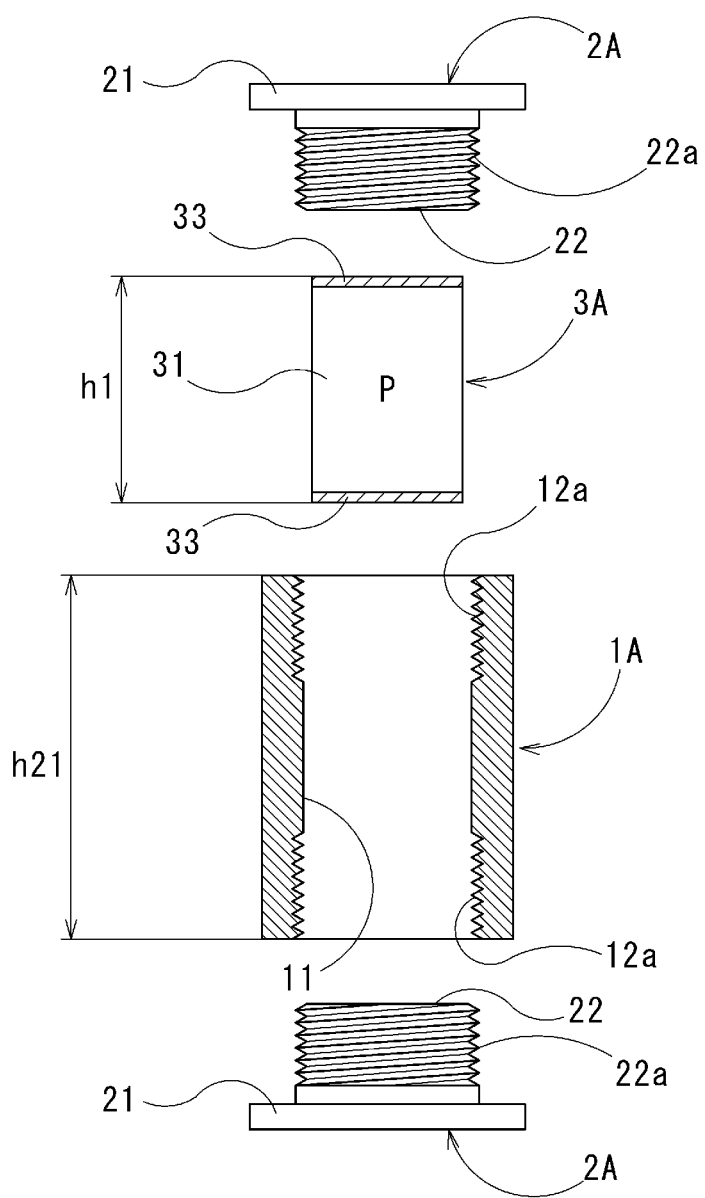
FIG. 3 It is an exploded sectional view of the thermoelectric conversion cell shown in FIG. 1.
Figure 4:
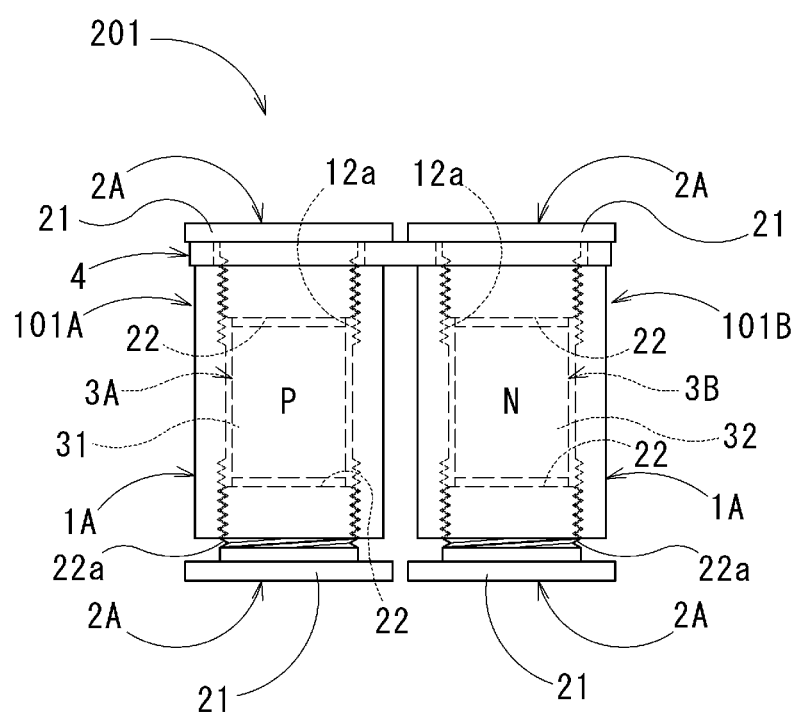
FIG. 4 It is a frontal view of a thermoelectric conversion module using the thermoelectric conversion cell shown in FIG. 1.

FIG. 4 shows an embodiment of a thermoelectric conversion module 201. This thermoelectric conversion module 201 is provided with a plurality of thermoelectric conversion cells 101A and 101B, and has a structure in which a first thermoelectric conversion cell 101A provided with a P-type thermoelectric conversion element 31 and a second thermoelectric conversion cell 101B provided with an N-type thermoelectric conversion element 32 are connected interposing a connecting member 4 having electric conductivity, and the P-type thermoelectric conversion element 31 and the N-type thermoelectric conversion element 32 are connected in series. As thermoelectric conversion elements configuring the thermoelectric conversion cells 101A and 101B, the P-type thermoelectric conversion element 31 or the N-type thermoelectric conversion element 32 are used. Note that, in FIG. 1 to FIG. 3, the first thermoelectric conversion cell 101A using the P-type thermoelectric conversion element 31 is illustrated as one example.

Figure 1:
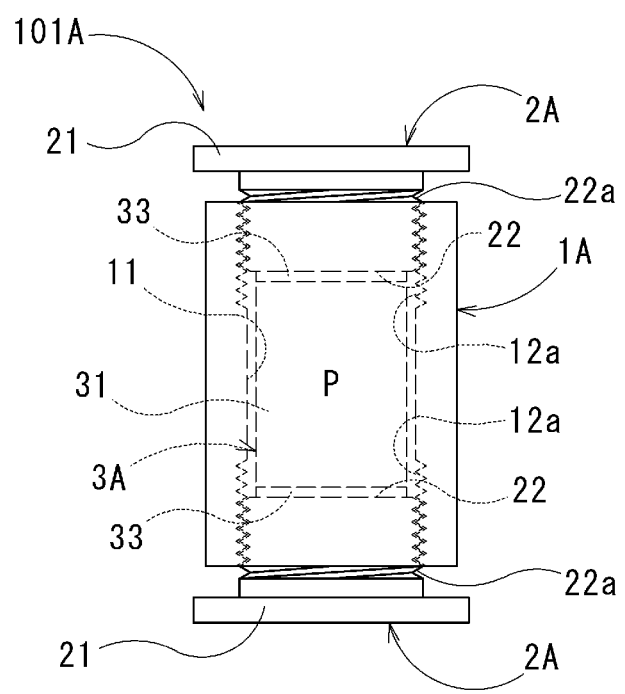
FIG. 1 It is a frontal view showing a thermoelectric conversion cell of a first embodiment according to the present invention.
Figure 2:
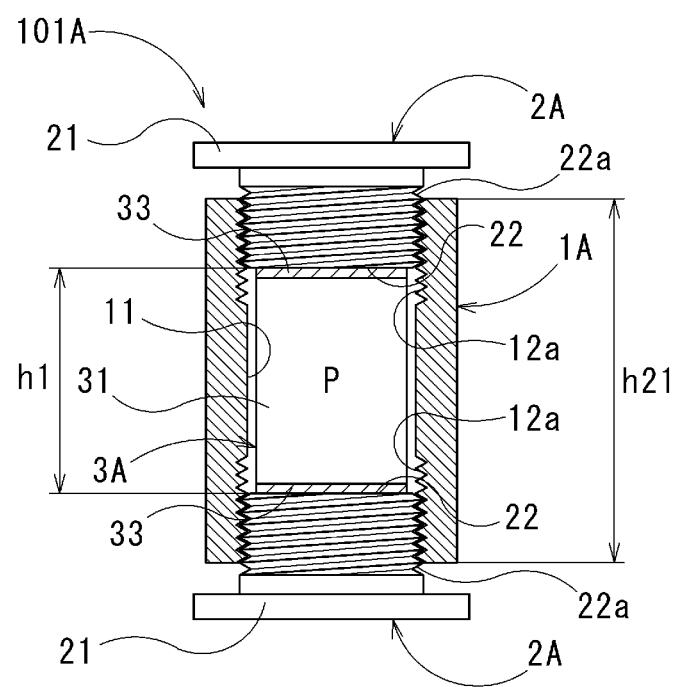
FIG. 2 It is a vertical sectional view of the thermoelectric conversion cell shown in FIG. 1.

The first thermoelectric conversion cell 101A has a structure provided with an insulating member 1A having one (a single) through hole 11, a thermoelectric conversion member 3A having the one (a single) P-type thermoelectric conversion element 31 (thermoelectric conversion element) enclosed in the through hole 11, and a couple of electrode members 2A and 2A respectively connected to both ends of the insulating member 1A, as shown in FIG. 1 to FIG. 3. The second thermoelectric conversion cell 101B shown in FIG. 4 is configured by using the insulating member 1A and the couple of electrode members 2A and 2A which are common in the thermoelectric conversion cell 101A, and has a structure in which thermoelectric conversion member 3B enclosed in the through hole 11 has the one (a single) N-type thermoelectric conversion element 32.

The insulating member 1A is formed from a member having insulation property: preferably used are materials having low thermal conductivity such as standard ceramics (i.e., earthenware, porcelain, Steatite, cordierite, forsterite, mullite, maserite, macor, photoveel, zirconia, titania, yttria, alumina, silicon nitride), glass, resin and the like. The insulating member 1A of the present embodiment is provided cylindrically by forming the through hole 11 inside: female threaded portions 12a are provided at both opening parts (both ends) of the through hole 11, so that an insulation-side threaded portion of the present invention is configured from these female threaded portions 12a. Note that, the female threaded portions 12a are (right-hand screws).

The electrode members 2A are formed from members having conductivity, preferably used is metal material such as aluminum, aluminum alloy, brass and the like. The electrode members 2A have, as shown in FIG. 1 to FIG. 3, respective circular-plate head parts 21 and columnar electrode parts 22 standing from the head parts 21. Moreover, male threaded portions 22a corresponding to the female threaded portions 12a of the insulating member 1A are provided at an external circumference surface of the electrode part 22. The male threaded portions 22a form an electrode-side threaded portion of the present invention.

The electrode member 2A is detachably attached to the insulating member 1A by screwing the male threaded portions 22a thereof and the female threaded portions 12a of the insulating member 1A together. By screwing the male threaded portions 22a and the female threaded portions 12a together, a bottom surface of the electrode part 22 is in contact with an end part of the thermoelectric conversion member 3A or the thermoelectric conversion member 3B enclosed in the through hole 11. Moreover, by screwing the female threaded portions 12a and the male threaded portions 22a, one couple of the electrode members 2A and 2A are connected to both the end parts of the insulating member 1A respectively, so that the thermoelectric conversion member 3A or the thermoelectric conversion member 3B is held between the electrode parts 22 and 22 of the electrode members 2A and 2A, thereby electrically connecting the electrode member 2A to the thermoelectric conversion member 3A or the thermoelectric conversion member 3B.

As described above, since the electrode members 2A is not bonded to the thermoelectric conversion member 3A (the P-type thermoelectric conversion element 31) and the thermoelectric conversion member 3B (the N-type thermoelectric conversion element 32); fastening or loosening female threaded portions 12a of the insulating member 1A and the male threaded portions 22a of the electrode members 2A, it is easy to assemble or disassemble the thermoelectric conversion cells 101A and 101B. Note that, in accordance with sizes of the thermoelectric conversion members 3A and 3B, the electrode parts 22 of the electrode members 2A are formed to have an area at the connected parts (the bottom surfaces) to the thermoelectric conversion member 3A and 3B slightly larger than that of the end surfaces of the thermoelectric conversion members 3A and 3B.

Material for the P-type thermoelectric conversion element 31 and the N-type thermoelectric conversion element 32 is as follows: tellurium compound, skutterudite, filled skutterudite, Heusler, half Heusler, clathrate, silicide, oxide, silicon germanium, and the like: by dopant, there are compounds which can be both P-type and N-type, and compounds which have either one of the properties.

Material for the P-type thermoelectric conversion element is as follows: $Bi_2Te_3$, $Sb_2Te_3$, $PbTe$, TAGS(=Ag—Sb—Ge—Te), $Zn_4Sb_3$, $CoSb_3$, $CeFe_4Sb_{12}$, $Yb_{14}MnSb_{11}$, FeVAl, $MnSi_{1.73}$, $FeSi_2$, $Na_xCoO_2$, $Ca_3Co_4O_7$, $Bi_2Sr_2Co_2O_7$, SiGe, and the like.

Material for the N-type thermoelectric conversion element is as follows: $Bi_2Te_3$, PbTe, $La_3Te_4$, $CoSb_3$, FeVAl, ZrNiSn, $Ba_8Al_{16}Si_{30}$, $Mg_2Si$, $FeSi_2$, $SrTiO_3$, $CaMnO_3$, ZnO, SiGe, and the like.

Because the silicide-type material does not involve the environment much and there are rich reserves so it draws attention, silicide-type material is used for the present embodiment out of these materials. That is to say, the P-type thermoelectric conversion element 31 is made of manganese silicide ($MnSi_{1.73}$) and the N-type thermoelectric conversion element 32 is made of magnesium silicide ($Mg_2Si$). These P-type thermoelectric conversion element 31 and the N-type thermoelectric conversion element 32 are formed into, for example, a columnar shape of 1 mm to 8 mm square, a length thereof (a length along a through-direction of the through hole 11) is 2 mm to 8 mm. Moreover, as shown in FIG. 2 and FIG. 3, a length h1 of the thermoelectric conversion element 31 and 32 is formed smaller than a length (a height) h2 of the insulating member 1A.

The thermoelectric conversion elements 31 and 32 are made by after milling mother alloy into a diameter not larger than 75 µm by a ball mill for example, then forming a bulk material having a disk-shape or a plate-shape for example by discharge plasma sintering, hot press, or hot-isotropic pressurizing, and then cutting into a columnar shape for example. Metalized layers 33 made of plating such as nickel, gold or the like are formed on both end surfaces of the thermoelectric conversion elements 31 and 32.

In the thermoelectric conversion cells 101A and 101B of the present embodiment, enclosing the thermoelectric conversion member 3A having the P-type thermoelectric conversion element 31 or the thermoelectric conversion member 3B having the N-type thermoelectric conversion element 32 within the through hole 11 of the insulating member 1A, and holding the thermoelectric conversion member 3A or the thermoelectric conversion member 3B between the electrode members 2A and 2A, so that the electrode members 2A and the thermoelectric conversion members 3A and 3B are electrically connected. Accordingly, it is possible to prevent breakage of the members owing to the difference between the thermal expansion of the difference metals.

The thermoelectric conversion cells 101A and 101B are easy to be assembled or disassembled by fastening or loosening the female threaded portions 12a of the insulating member 1A and the male thread members 22a of the electrode members 2A. Accordingly, even when the thermoelectric conversion members 3A and 3B enclosed in the insulating member 1A is broken or the thermoelectric conversion members 3A and 3B are necessary to be substituted in accordance with design changes, it is easy to substitute the thermoelectric conversion members 3A and 3B.

As shown in FIG. 4, by coupling the first thermoelectric conversion cells 101A and the second thermoelectric conversion cells 101B using the first thermoelectric conversion cell 101A having the P-type thermoelectric conversion element 31 and the second thermoelectric conversion cell 101B having the N-type thermoelectric conversion element 32, so as to connect the P-type thermoelectric conversion elements 31 and the N-type thermoelectric conversion element 32 alternately in series, the thermoelectric conversion module 201 can be easily manufactured. The thermoelectric conversion module 201 is manufactured by arranging the first thermoelectric conversion cell 101A and the second thermoelectric conversion cell 101B in parallel, and connecting the electrode members 2A and 2A disposed on one side part (an upper side in FIG. 4) via the connecting member 4. The connecting member 4 is formed from a member having conductivity: for example, aluminum aluminum alloy can be suitably used.

By holding the connecting member 4 between the head parts 21 of the electrode members 2A and the insulating members 1A, the first thermoelectric conversion cell 101A and the second thermoelectric conversion cell 101B are electrically connected via the electrode members 2A and the connecting member 4, so that the P-type thermoelectric conversion element 31 and the N-type thermoelectric conversion element 32 are connected in series. The connecting member 4 is detachably provided by fastening or loosening the male threaded portions 22a of the electrode members 2A and the female threaded portions 12a of the insulating members 1A.

Figure 5:
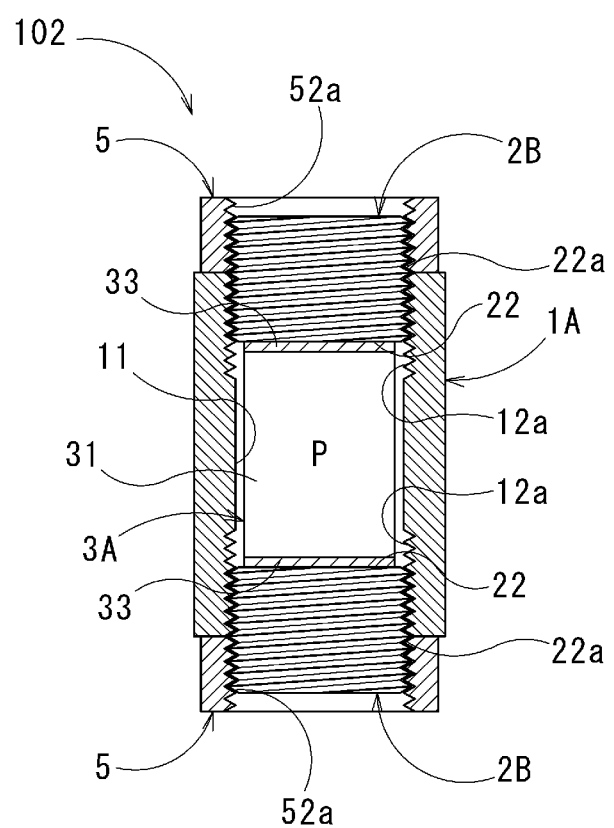
FIG. 5 It is a vertical sectional view showing a thermoelectric conversion cell of a second embodiment according to the present invention.

In the thermoelectric conversion cells 101A and 101B shown in FIG. 1 to FIG. 4, although the electrode members 2A having the head parts 21 are used, the electrode members 2B can be configured from so-called locking screws in which male threaded portions 22a are formed on whole outer circumference surfaces, as in a thermoelectric conversion cell (a first thermoelectric conversion cell) 102 of a second embodiment shown in FIG. 5. Nuts 5 having female threaded portions (right-hand threads) 52a corresponding to the male threaded portions 22a can be attached to the male threaded portions 22a of the electrode members 2B protruding from the insulating member 1A, so that a height of the thermoelectric conversion cell 102 can be freely adjusted by screwing the male threaded portions 22a of the electrode members 2B to the female threaded portions 52a of the nuts 5. Accordingly, it is possible to improve flexibility of the height of the thermoelectric conversion cell 102. The nuts 5 are made from members having conductivity: metal materials such as aluminum, aluminum alloy, brass or the like are suitably used.

In the thermoelectric conversion cell 102 of the second embodiment, common elements with the thermoelectric conversion cells 101A and 101B and the thermoelectric conversion module 201 in the first embodiment are denoted by the same reference symbols and explanation thereof are omitted. Moreover, similarly, also in thermoelectric conversion cells and thermoelectric conversion modules in a third to thirteenth embodiments stated below, common elements with the aforementioned embodiments will be denoted by the same reference symbols and explanation thereof will be omitted.

The thermoelectric conversion module 201 shown in FIG. 4 has a structure in which the first thermoelectric conversion cell 101A including the P-type thermoelectric conversion element 31 and the second thermoelectric conversion cell 101B including the N-type thermoelectric conversion element 32 are arranged in parallel. As in a thermoelectric conversion module 202 of a third embodiment, a structure in which first thermoelectric conversion cells 103A including the P-type thermoelectric conversion element 31 and second thermoelectric conversion cells 103B including the N-type thermoelectric conversion element 32 are arranged alternately in a through-direction of the through hole 11 may be applied.

In the thermoelectric conversion module 202, the respective first thermoelectric conversion cells 103A and second thermoelectric conversion cells 101B are connected via the electrode members 2B fixed to the female threaded portion 12a of the through holes 11. The electrode members 2B have the male threaded portion 22a on the whole circumference surface as described above, and configured from so-called a set screw. The electrode parts 22 and 22 are respectively formed on an upper surface and a bottom surface of the electrode members 2B, so that the electrode members 2B have a structure in which two electrode members are formed integrally. By these electrode members 2B, a connected-type electrode member in the present invention is configured, so that the first thermoelectric conversion cells 103A and the second thermoelectric conversion cells 103B are connected by the electrode members 2B.

Figure 6:
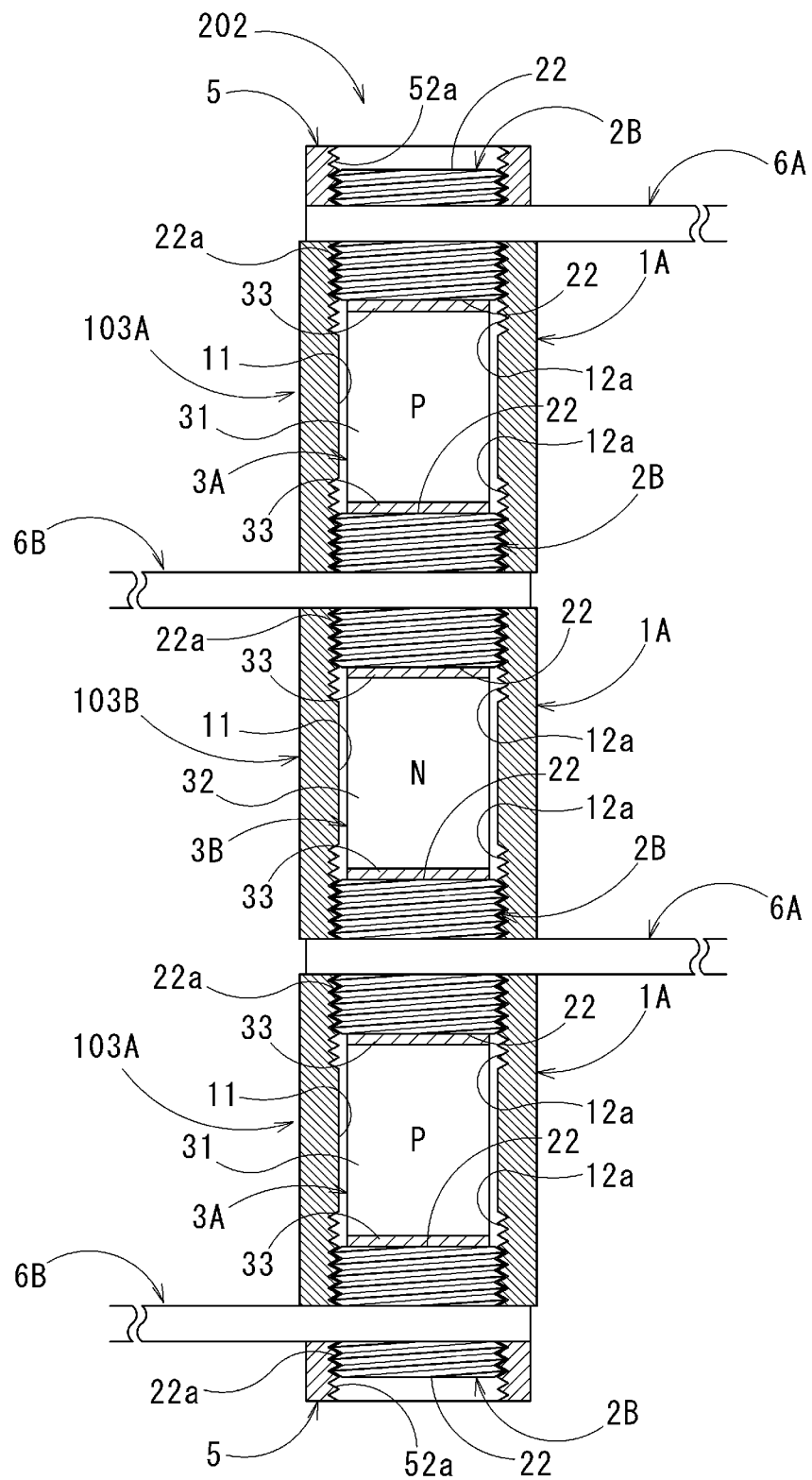
FIG. 6 It is a frontal view showing a thermoelectric conversion module using the thermoelectric conversion cell of the second embodiment.

Moreover, high-temperature side fin 6A and low-temperature side fin 6B are alternately installed on each of the electrode members 2B of the thermoelectric conversion module 202. That is to say, in the thermoelectric conversion module 202, in individual units of the first thermoelectric conversion cell 103A and the second thermoelectric conversion cell 103B, the high-temperature side fin 6A is connected to the electrode member 2B connected to one end, and the low-temperature side fin is connected to the electrode member 2B connected to the other end. As a result, the thermoelectric conversion module 202 can generate electric power so that an electric current passes from an upper side to a lower side in FIG. 6 when a right side in FIG. 6 is a high-temperature side and a left side in FIG. 6 is a low-temperature side.

Figure 7:
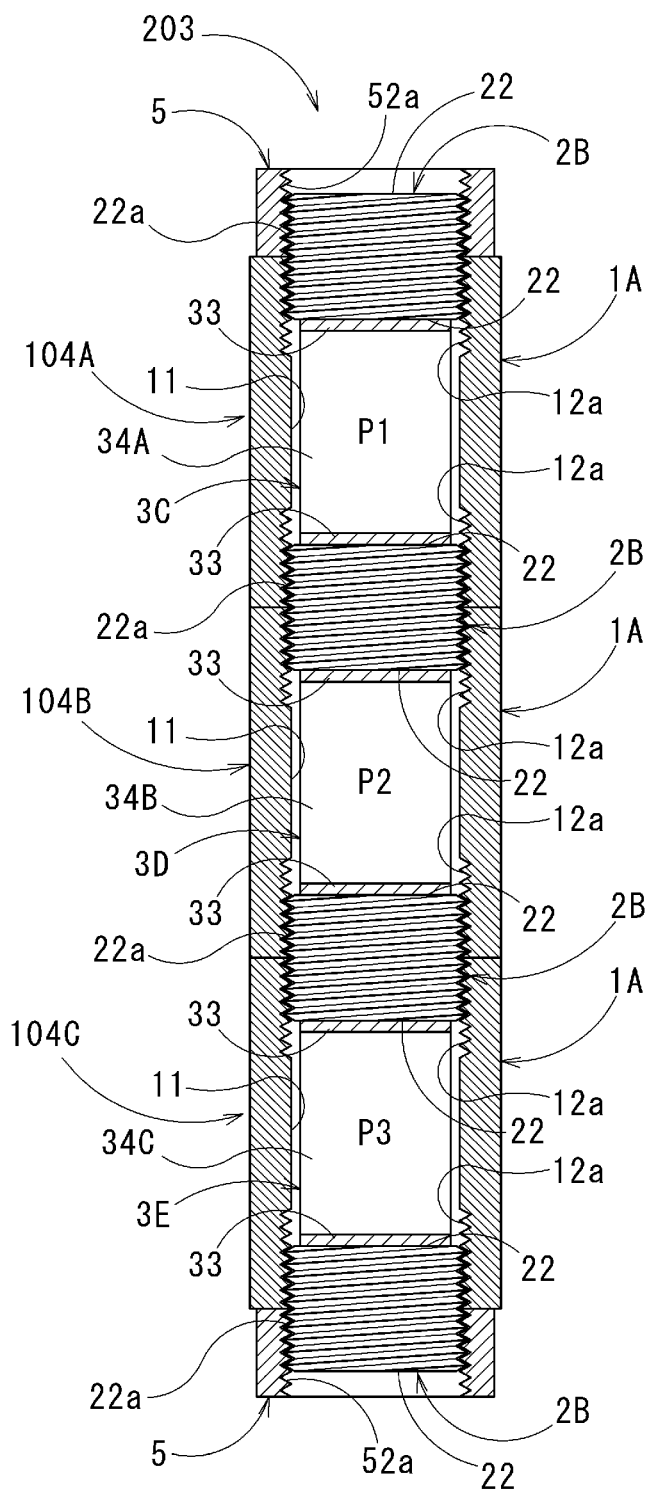
FIG. 7 It is a vertical sectional view showing a thermoelectric conversion cell of a third embodiment of the present invention.

In the thermoelectric conversion cells 101A, 101B, 102, 103A and 103B in the above embodiments, the structure in which the thermoelectric conversion members 3A and 3B enclosed in the through hole 11 have either one (a single) thermoelectric conversion element of the P-type thermoelectric conversion element 31 or the N-type thermoelectric conversion element 32, and the thermoelectric conversion modules 201 and 202 are configured from coupling pairs of the P-type thermoelectric conversion element 31 and the N-type thermoelectric conversion element 32 so as to connect alternately in series though: as in a thermoelectric conversion module 203 of a third embodiment shown in FIG. 7, it is possible to have a structure in which thermoelectric conversion cells 104A to 104C provided with thermoelectric conversion elements (P-type thermoelectric conversion elements) 34A to 34C with various ranges of usable temperature are stacked and connected in series from a high-temperature side to a low-temperature side on a direction of temperature gradient.

By connecting the thermoelectric conversion cells 104A to 104C enclosing the thermoelectric conversion members 3C to 3E with the various ranges of usable temperature in series on the direction of the temperature gradient, it is possible to configure a segment structure, and highly efficiency of the thermoelectric conversion module can be attempt.

Also in the thermoelectric conversion module 203, the thermoelectric conversion members 3C to 3E are electrically connected to the electrode members 2B respectively by fixing the couple of the electrode members 2B and 2B to both opening parts of the through hole of the insulating member 1A so as to hold the thermoelectric conversion members 3C to 3E between the electrode members 2B and 2B. Furthermore, other than layering the thermoelectric conversion members 3C to 3E via the electrode members 2B, the thermoelectric conversion members 3C to 3E can be layered via conductive members of aluminum or the like. By layering the thermoelectric conversion members 3C to 3D via the conductive members, the conductive members and the thermoelectric conversion members can be in closely contact with each other, so that electric resistance can be reduced.

Figure 8:
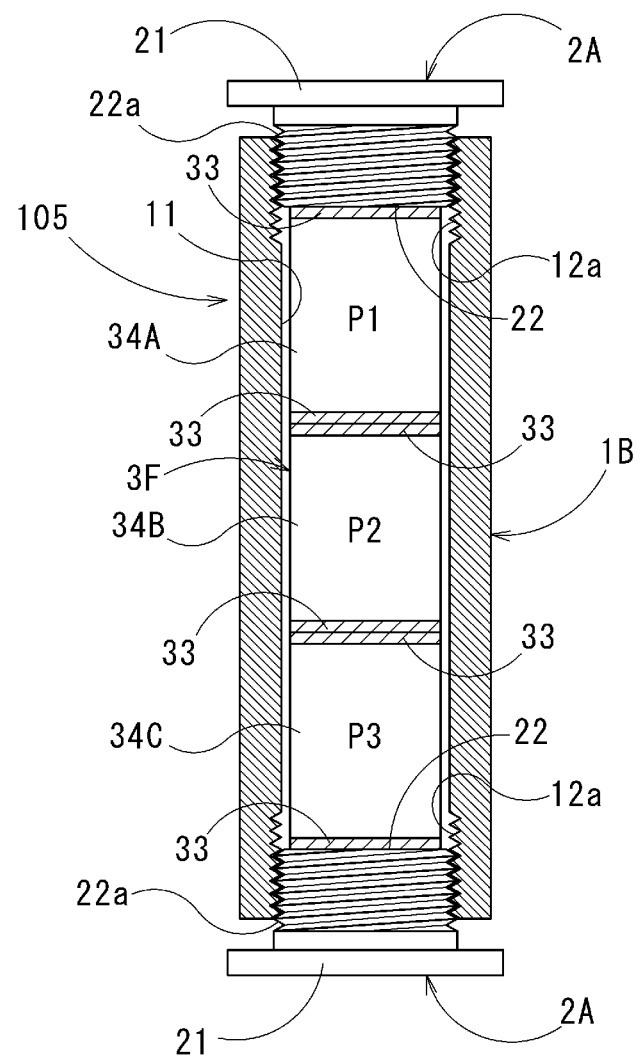
FIG. 8 It is a vertical sectional view showing a thermoelectric conversion cell of a fourth embodiment according to the present invention.

As in a thermoelectric conversion cell 105 of a fourth embodiment shown in FIG. 8, a thermoelectric conversion member 3F enclosed in the through hole 11 of an insulating member 1B may have a structure in which a plurality of thermoelectric conversion elements (P-type thermoelectric conversion elements) 34A to 34C are piled in the through-direction of the through hole 11 directly or via conductive members. It is also possible to connect the thermoelectric conversion elements 34A to 34C by piling the thermoelectric conversion elements 34A to 34C and enclosing them in the through hole 11 so as to hold them between the electrode members 2A and 2A attached on and below the insulating member 1A. In this case, there is no electric resistance and thermal resistance by the electrode members; it is possible to obtain higher output than in a case using the electrode members.

It is prefer to use a structure shown in FIG. 7 in a case in which chemical reaction occurs or in a case in which the ranges of usable temperature are largely different; between the thermoelectric conversion elements 34A to 34C inside the through hole 11 of the insulating member 11B; between the metallized layers 33; or between the metallized layers 33 and the thermoelectric conversion elements. In this case, as shown in FIG. 7, the thermoelectric conversion elements 34A to 34C can be separated from each other by using the electrode members 2B, so that it is possible to transfer temperature which is lowered enough than temperature transferred from the low-temperature side of the thermoelectric conversion member 3C arranged at the upper side to the high-temperature side of the thermoelectric conversion member 3D arranged below it, for example.

As described above, by coupling the thermoelectric conversion elements (the thermoelectric conversion members) made of different materials; there are choices of materials, so that the stable thermoelectric conversion module having even properties can be configured. By coupling the thermoelectric conversion cells having the same polarity in parallel, it is possible to control inner resistance of the thermoelectric conversion module, and freely design the thermoelectric conversion module in accordance with load resistance of the output destination.

Figure 9:
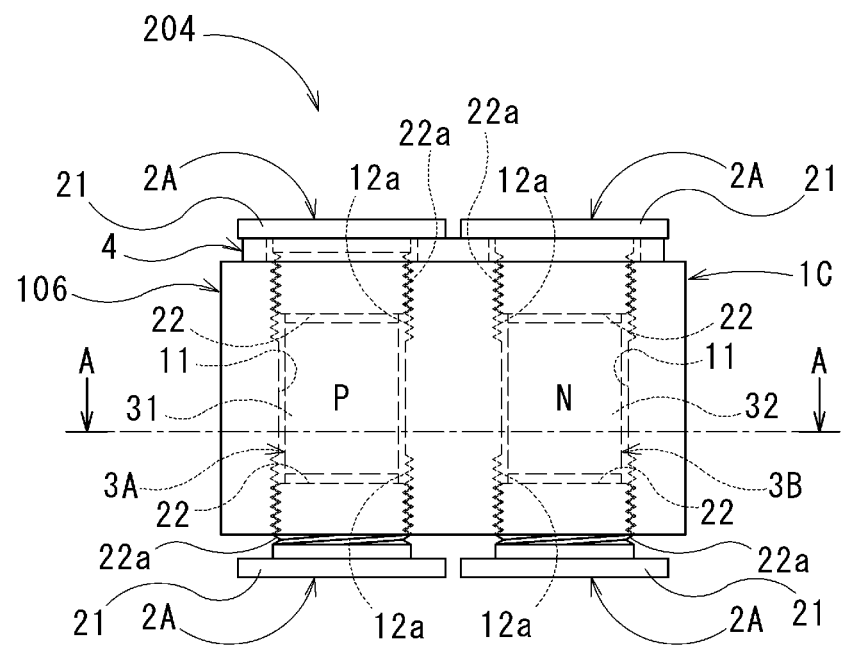
FIG. 9 It is a frontal view of a thermoelectric conversion module using a thermoelectric conversion cell of a fifth embodiment according to the present invention.
Figure 10:
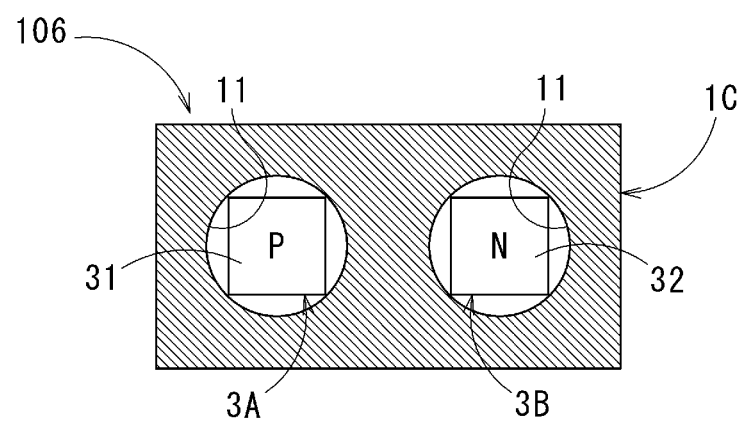
FIG. 10 It is a plan sectional view taken along the A-A line in FIG. 9.

The thermoelectric conversion cells 101A, 101B, 102, 103A, 103B, 104 to 104C and 105 in the above embodiments have the structure using the insulating member 1A having one (a single) through hole 11 though: a structure using an insulating member 1C having a plurality of through holes 11 is also acceptable as in a thermoelectric conversion cell 106 of a fifth embodiment shown in FIG. 9 and FIG. 10. In the insulating member 1C, as shown in FIG. 9 and FIG. 10, two through holes 11 are arranged in parallel, and the thermoelectric conversion member 3A having the P-type thermoelectric conversion element 31 and the thermoelectric conversion member 3B having the N-type thermoelectric conversion element 32 are enclosed in the through holes 11 respectively.

Also in this case, by the pair of the electrode members 2A and 2A fixed to both the opening parts of the through holes 11, the thermoelectric conversion member 3A or the thermoelectric conversion member 3B enclosed in the through hole 11 is held, so that the electrode members 2A and the thermoelectric conversion members 3A and 3B can be electrically connected. By connecting the electrode members 2A and 2A arranged at one side of the insulating member 1C via the connecting member 4, it is possible to connect the P-type thermoelectric conversion element 31 and the N-type thermoelectric conversion element 32 of the thermoelectric conversion members 3A and 3B enclosed inside the through holes 11 alternately in series, so that a thermoelectric conversion module 204 can be easily manufactured.

Figure 11:
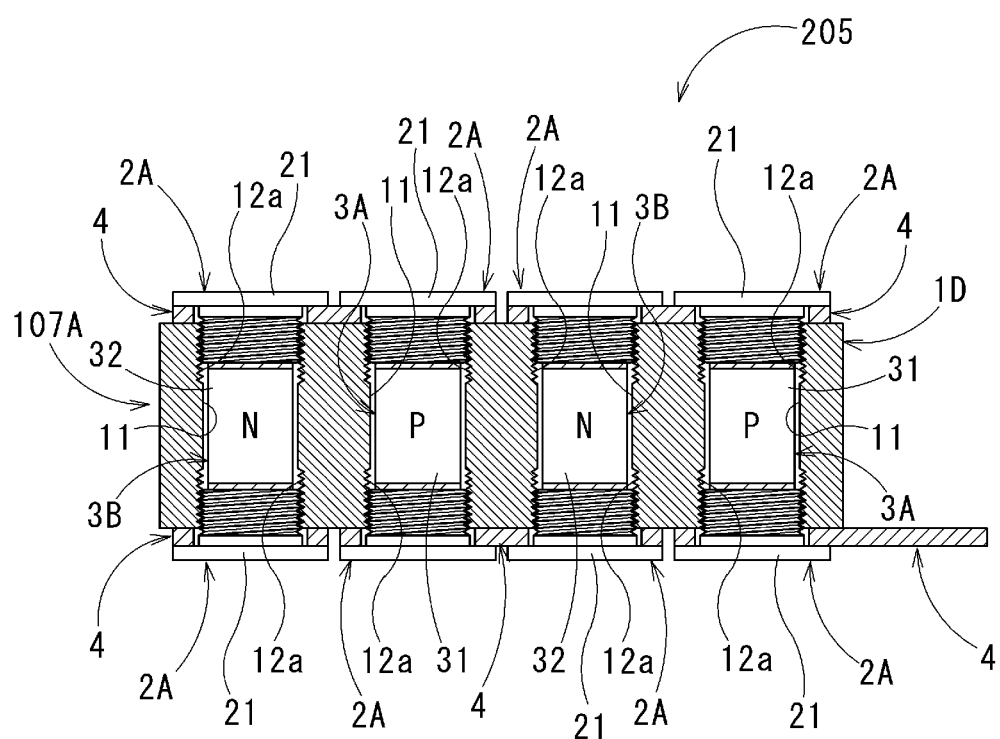
FIG. 11 It is a vertical sectional view of a thermoelectric conversion module using a thermoelectric conversion cell of a six embodiment according to the present invention.
Figure 12:
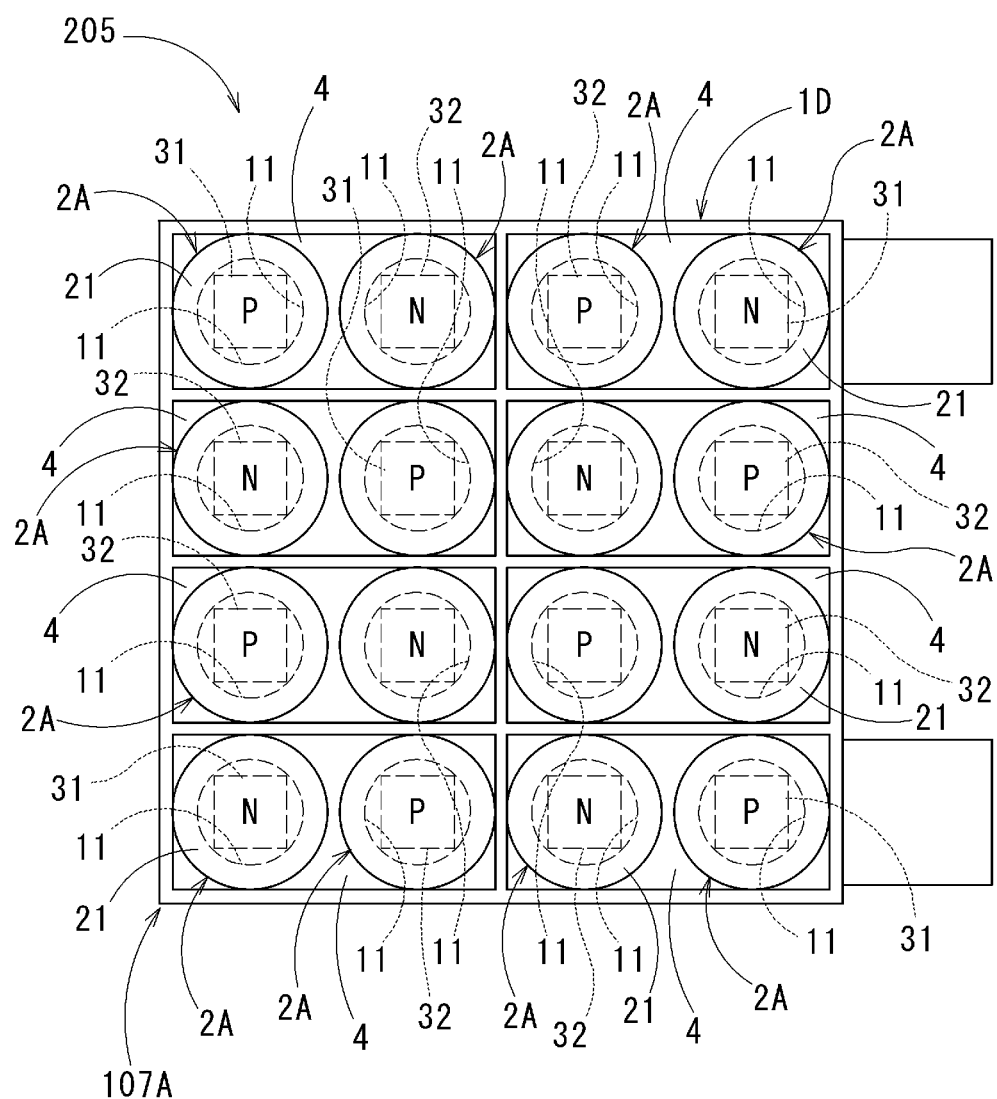
FIG. 12 It is a top view of the thermoelectric conversion module shown in FIG. 11.
Figure 13:
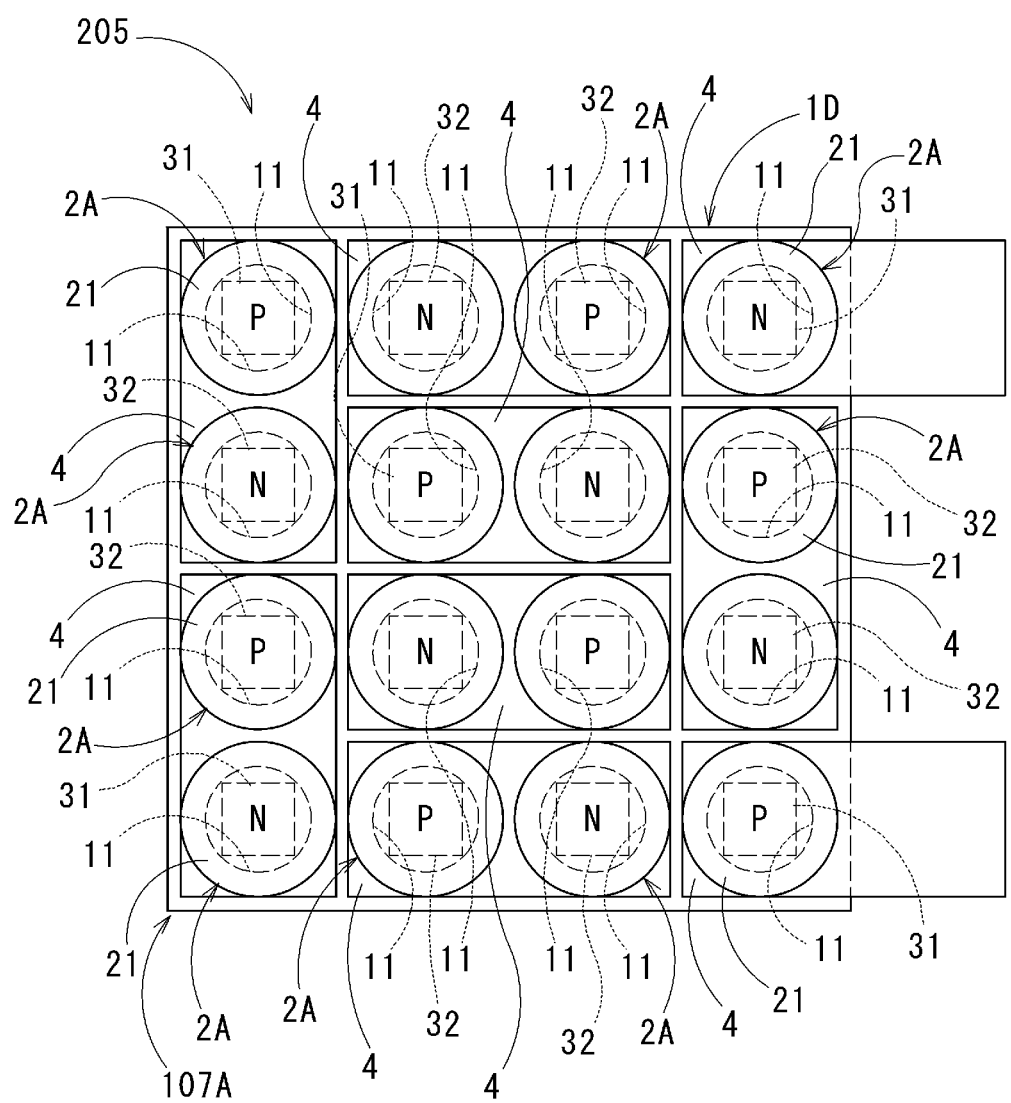
FIG. 13 It is a bottom view of the thermoelectric conversion module shown in FIG. 11.

As in a thermoelectric conversion cell 107A of a sixth embodiment shown in FIG. 11 to FIG. 13, a thermoelectric conversion module 205 can be configured by using an insulating member 1D having three or more through holes 11. In the insulating member 1D, as shown in FIG. 12 and FIG. 13, sixteen through holes 11 in total are arranged in a matrix, and either one of the thermoelectric conversion member 3A having P-type thermoelectric conversion element 31 or the thermoelectric conversion member 3B having the N-type thermoelectric conversion element 32 is enclosed in the respective through holes 11. By attaching the electrode members 2A and 2A to both the opening part of the through holes 11, the thermoelectric conversion member 3A or the thermoelectric conversion member 3B enclosed in the through holes 11 is held between one pair of electrode members 2A and 2A, so that the electric members 2A and the thermoelectric conversion members 3A and 3B are electrically connected.

By connecting the electrode members 2A and 2A attached to the through holes 11 of the thermoelectric conversion cell 107 via the connecting members 4, the P-type thermoelectric conversion element 31 and the N-type thermoelectric conversion element 32 of the thermoelectric conversion members 3A and 3B enclosed in the through holes 11 can be alternately connected in series, so that the thermoelectric conversion module 205 can be easily manufactured.

Figure 14:
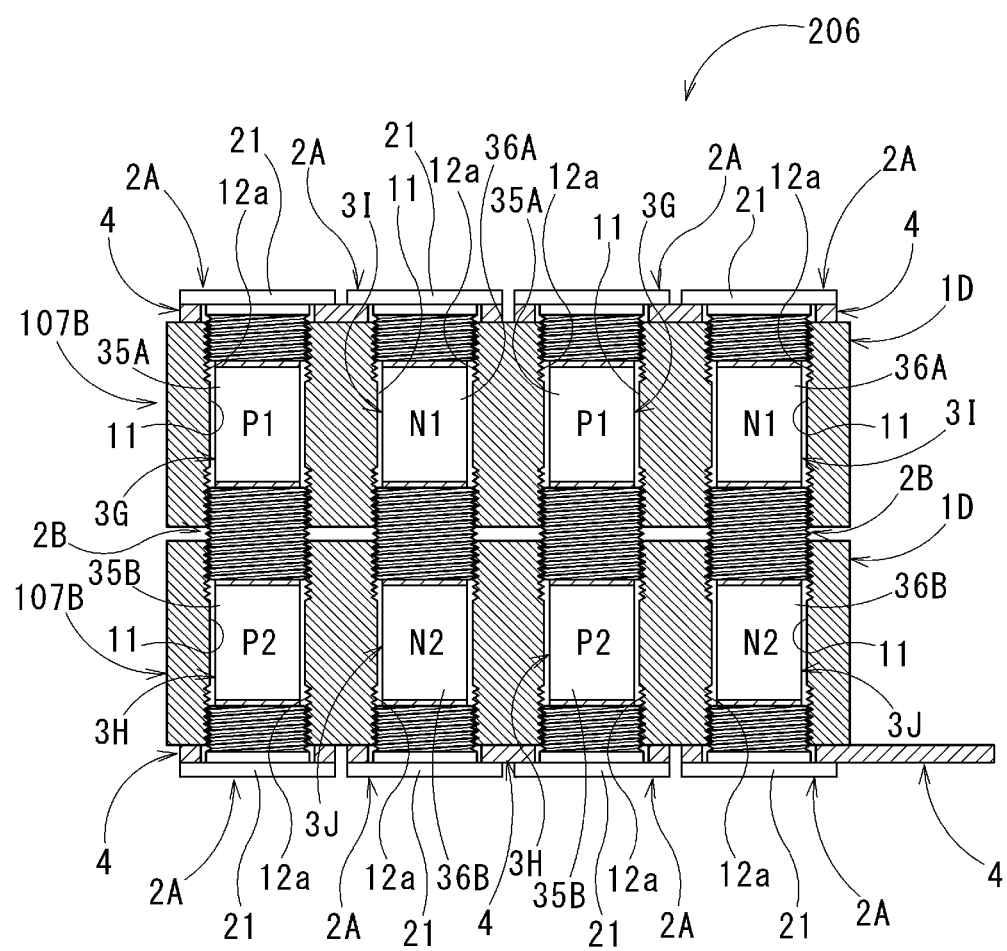
FIG. 14 It is a vertical sectional view of a thermoelectric conversion module using a thermoelectric conversion cell of a seventh embodiment according to the present invention.

As shown in FIG. 14, piling a plurality of thermoelectric conversion cells 107B in which a plurality of thermoelectric conversion members 3G to 3J, it is also possible to configure a thermoelectric conversion module 206 having a segment structure. In the thermoelectric conversion module 206 of a seventh embodiment, the electrode members 2B attached to the through holes 11 connect the two thermoelectric conversion cells 107B, and the connecting members 4 connect the electrode members 2A and 2A attached to the through holes 11: so that P-type thermoelectric conversion elements 35A and P-type thermoelectric conversion elements 35B and a N-type thermoelectric conversion element 36A and N-type thermoelectric conversion element 36B are alternately connected in series.

For the respective thermoelectric conversion members 3G to 3J enclosed in the through holes 11 of the thermoelectric conversion module 206, as in the thermoelectric conversion member 3F of the thermoelectric conversion cell 105 shown in FIG. 8, a structure in which a plurality of thermoelectric conversion elements including a P-type thermoelectric conversion element or a N-type thermoelectric conversion element are piled directly or via a conductive member in a through-direction of the through hole 11 can be used. Moreover, a thermoelectric conversion module having a same structure as that of the thermoelectric conversion module 206 can be configured by arranging a first thermoelectric conversion cell having a thermoelectric conversion member formed from a P-type thermoelectric conversion element as that in the thermoelectric conversion cell 105 shown in FIG. 8 and a second thermoelectric conversion cell having a thermoelectric conversion member formed form a N-type thermoelectric conversion element in parallel and disposing them by stacking in a through-direction of a through hole.

Figure 15:
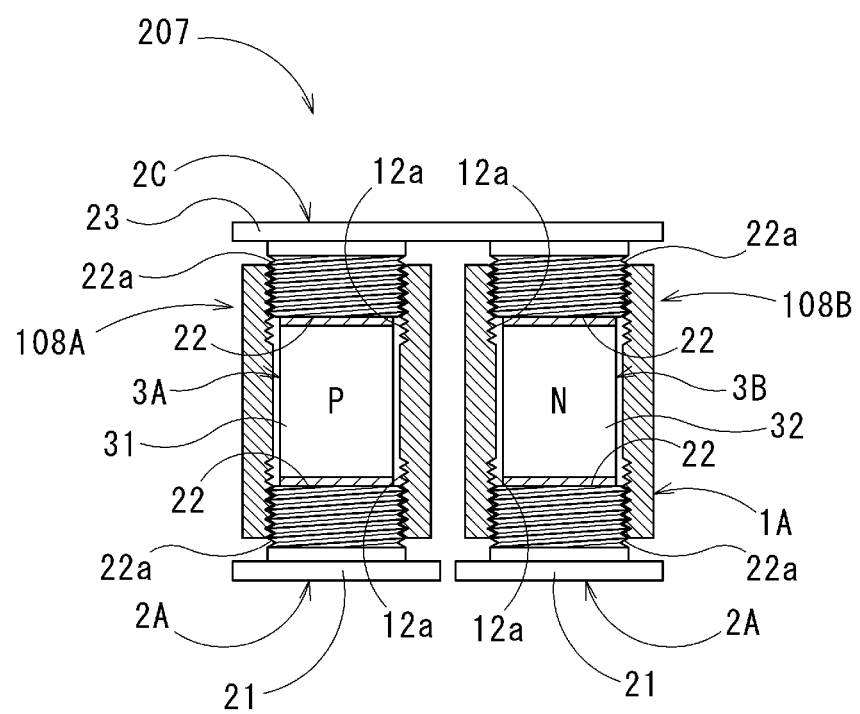
FIG. 15 It is a vertical sectional view of a thermoelectric conversion module using a thermoelectric conversion cell of an eighth embodiment according to the present invention.

In the thermoelectric conversion module 201 of the first embodiment and the like, the electrode members 2A and 2A attached to the through holes 11 are connected by the connecting member 4 though; as in a thermoelectric conversion module 207 of an eighth embodiment shown in FIG. 15, it is also possible to electrically connect the electrode members 3A and 3B via a connected-type electrode member 2C having the two electrode parts 22 and 22 by arranging a thermoelectric conversion cell 108A having the P-type thermoelectric conversion element 31 and a second thermoelectric conversion cell 108B having the N-type thermoelectric conversion element 32 in parallel.

The two electrode parts 22 and 22 of the connected-type electrode member 2C are formed integrally with a head part 23 therebetween, so that it is possible to attach the individual insulating members 1A to the male threaded portion 22a of the respective electrode parts 22. That is to say, after joining the one of the female threaded portions 12a of the insulating member 1A with the male threaded portion 22a of the electrode parts 22 by screwing, the male threaded portion 22a of the electrode member 2A having a single electrode part 22 is joined with the other female threaded portion 12a of the insulating member 1A. As a result, the P-type thermoelectric conversion element 31 of the thermoelectric conversion member 3A and the N-type thermoelectric conversion element 32 of the thermoelectric conversion member 3B can be connected alternately in series.

Figure 16:
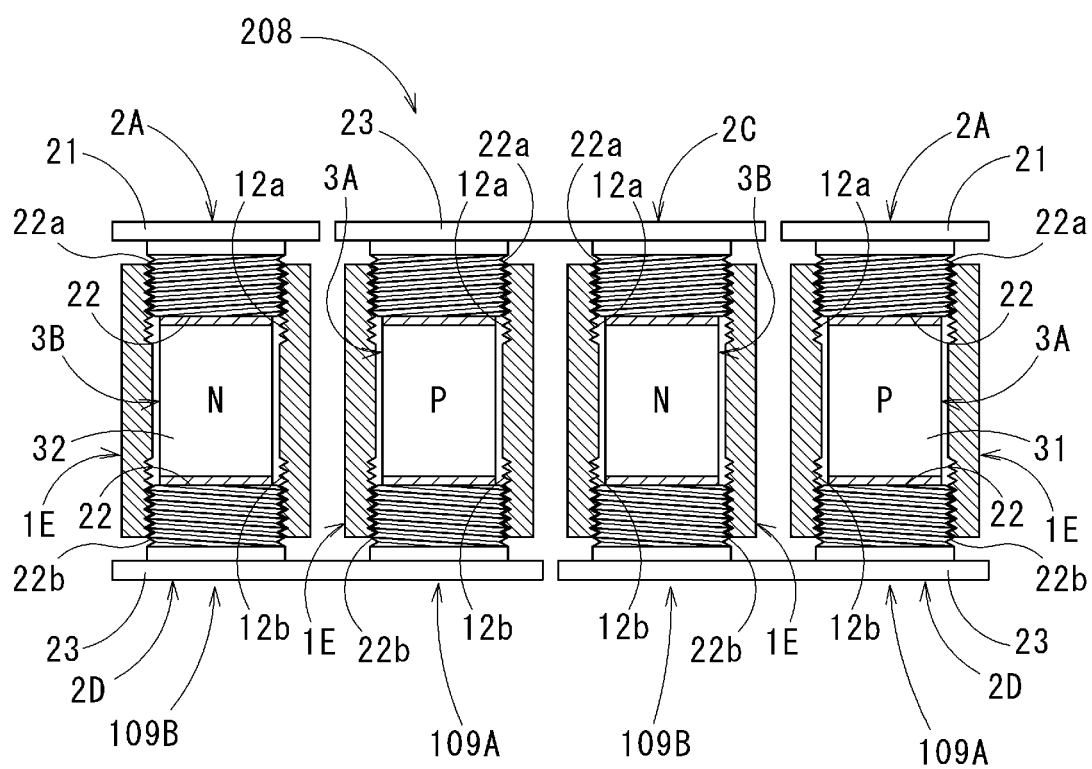
FIG. 16 It is a vertical sectional view of a thermoelectric conversion module using a thermoelectric conversion cell of a ninth embodiment according to the present invention.

In the above-mentioned first to eighth embodiments, a screw direction of the female threaded portion (the insulation-side threaded portion) 12a provided at both the ends of the insulating member is the same direction (a right-hand direction) though; as in a thermoelectric conversion module 208 of a ninth embodiment shown in FIG. 16, forming the female threaded portion 12a at the one side of insulating members 1E as a right-hand screw and forming the female threaded portion 12b at the other side as a left-hand screw, it is possible to make the screw directions (rotation directions) of the female threaded portions 12a and 12b to be the same. In this case, the electrode members 2A and 2C connected to the one end of the insulating member 1E in which the male threaded portions 22a which are the right-hand screws are formed at the electrode parts 22 are used in order to correspond the female threaded portions 12a at the one side. Furthermore, in order to correspond female threaded portions 12b at the other end, electrode members 2D connected to the other end of the insulating members 1E in which male threaded portions 22b which are left-hand screws are formed on the electrode parts 22 are used.

Configuring as above, when the insulating member 1E is rotated in one direction, it is possible to tighten or loosen the female threaded portions 12a disposed at both the ends of the insulating member 1E and the male threaded portions 22a of the electrode members 2A and 2C corresponding to the female threaded portions 12a; and the female threaded portion 12b at the other side with the male threaded portion 22b of the electrode member 2D corresponding to the female threaded portion 12b. As a result, it is possible to attach and detach the insulating member 1E and the pair of electrode members 2A and 2D or 2C and 2D connected to both the ends of the insulating member 1E at once. Accordingly, it is possible to couple a first thermoelectric conversion cell 109A having the P-type thermoelectric conversion element 31 and a second thermoelectric conversion cell 109B having the N-type thermoelectric conversion element 32 to make a plurality of pairs: it is possible to connect the P-type thermoelectric conversion elements 31 and the N-type thermoelectric conversion elements 32 alternately in series: so that the large-sized thermoelectric conversion module 208 can be easily manufactured.

Figure 17:
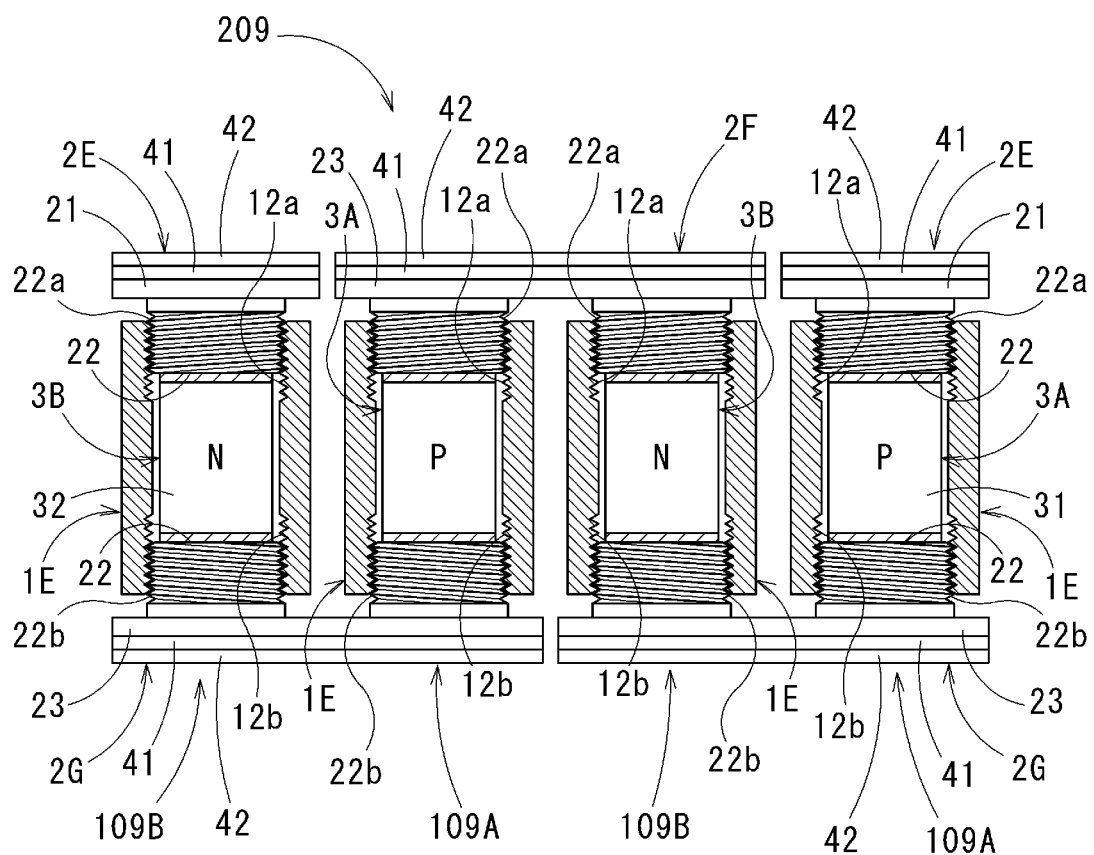
FIG. 17 It is a vertical sectional view of a thermoelectric conversion module using a thermoelectric conversion cell of a tenth embodiment according to the present invention.

Furthermore, as in a tenth embodiment shown in FIG. 17, a thermoelectric conversion module 209 can be also configured by using electrode members 2E to 2G of a structure having a ceramic plate 41 and a heat-transfer metal layer 42.

As the ceramic plate 41, a member having high thermal conductivity and insulation, such as general ceramics, for example, alumina ($Al_2O_3$), and aluminum nitride (AlN), silicon nitride ($Si_3N_4$), or a diamond thin-film substrate formed on a graphite plate and the like can be used. Moreover, a member which is easy to be elastically deformed or plastically deformed and has excellent thermal conductivity, such as aluminum, copper and the like, can be used for the heat-transfer metal layer 42.

Providing the ceramic plates 41 outside the electrode parts 22 (the head parts 21 and 23), when the thermoelectric conversion module 209 is installed at a heat source or the like in which a surface thereof is covered with conductive material, the ceramic plates 41 are interposed between the electrode parts 22 and the heat source or the like, so that it is possible to prevent the electrode parts 22 from being in contact with the heat source or the like. Accordingly, it is possible to reliably avoid an electric connection of the electrode parts 22 with the heat source of the like, and an insulated state can be favorably maintained.

Moreover, providing the heat-transfer metal layers 42 with the electrode members 2E to 2G, when the thermoelectric conversion module 209 is installed at the heat source or the like, the heat-transfer metal layers 42 can be in contact with the heat source or the like, so that the thermoelectric conversion module 209 and the heat source or the like can be more closely in contact with each other and it is possible to improve the heat transfer property. Accordingly, it is possible to improve a thermoelectric conversion property (power generation efficiency) of the thermoelectric conversion module 209.

In the above-mentioned first to tenth embodiments, the insulation-side threaded portions are configured from the female threaded portions 12a and 12b and the electrode-side threaded portions are configured from the male threaded portions 22a and 22b though; it is also possible that the insulation-side threaded portion be configured from a male threaded portion, and the electrode-side threaded portion be configured from a female threaded portion. Below, an example in which the insulation-side threaded portion is configured from the male threaded portion and the electrode-side threaded portion is configured from the female threaded portion will be explained.

Figure 18:
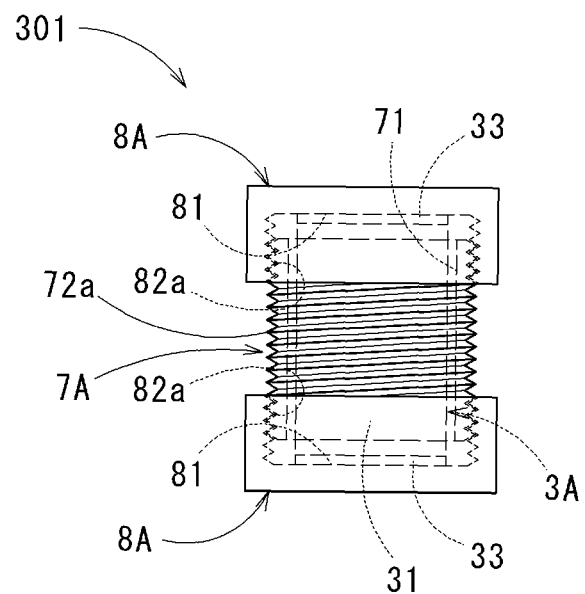
FIG. 18 It is a frontal view showing a thermoelectric conversion cell of an eleventh embodiment according to the present invention.
Figure 19:
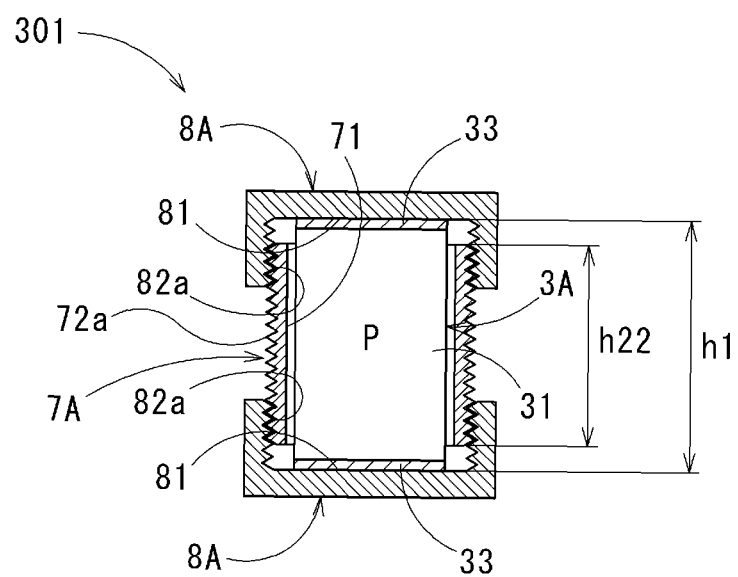
FIG. 19 It is a vertical sectional view of the thermoelectric conversion cell shown in FIG. 18.
Figure 20:
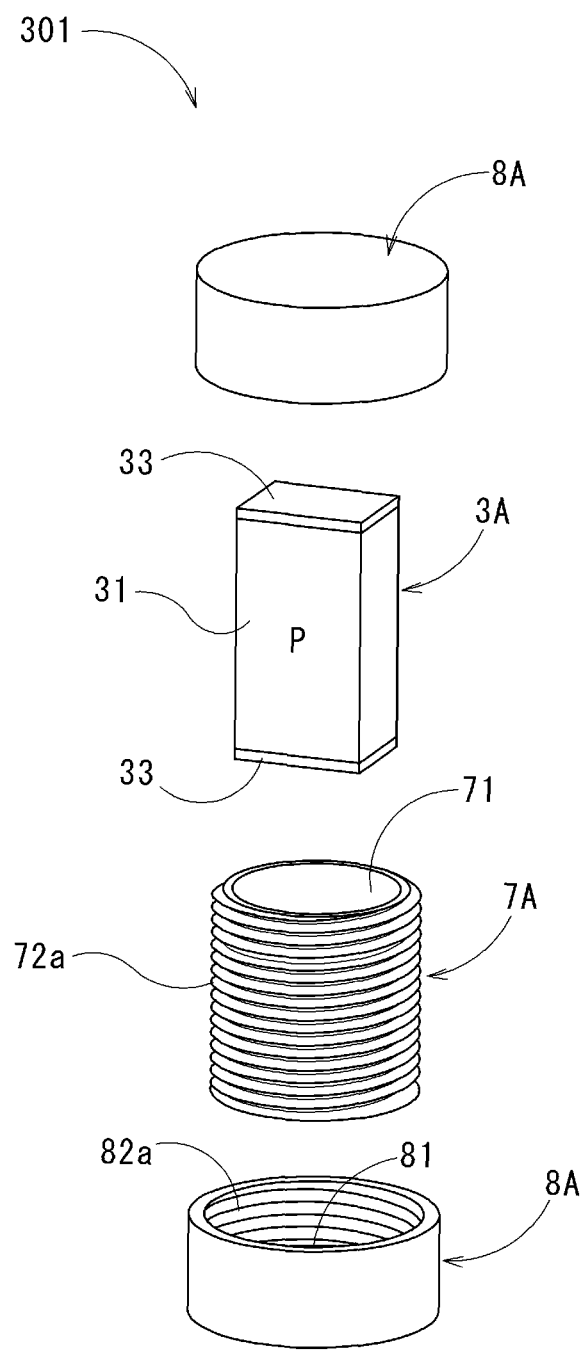
FIG. 20 It is an exploded perspective view of the thermoelectric conversion cell shown in FIG. 18.

FIG. 18 to FIG. 20 show a first thermoelectric conversion cell (a thermoelectric conversion cell) 301 of an eleventh embodiment. The first thermoelectric conversion cell 301 is provided with an insulating member 7A having a through hole 71, the thermoelectric conversion member 3A enclosed in the through hole 71, and electrode members 8A and 8A respectively connected to end parts of the insulating member 7A. Note that, members (materials) configuring the members are the same as those used in the above embodiments and the explanations thereof will be omitted.

The insulating member 7A is formed to have a cylindrical shape by forming the one through hole 71 inside: a male threaded portion 72a is formed on an outside thereof, and the male threaded portion 72a is formed on a whole outer peripheral surface including both the end parts of the insulating member 7A. Note that, the male threaded portion 72a is a right-hand screw: the insulation-side threaded portion of the present invention is configured from the male threaded portion 72a.

The electrode members 8A are formed to have a cap shape having a top surface part and a cylindrical part. Out of these, the top surface part is an electrode part 81: a female threaded portion 82a which is a right-hand screw corresponding to the male threaded portion 72a is formed on an inner peripheral surface of the cylindrical part. The female threaded portion 82a is the electrode-side threaded portion of the present invention. The insulating member 7A and the electrode members 8A are detachably attached to each other by screwing of the male threaded portion 72a with the female threaded portion 82a.

As shown in FIG. 19, the insulating member 7A is formed to have a length (a height) h22 smaller than a length h1 of the thermoelectric conversion member 3A. Therefore, when the thermoelectric conversion member 3A is enclosed in the through hole 71 by being inserted in the through hole 71, it is possible to dispose the thermoelectric conversion member 3A in a state in which end parts thereof are protrude from the through hole 71. Accordingly, when the couple of the electrode members 8A and 8A are connected to both the end parts of the insulating member 7A respectively, the electrode parts 81 can be reliably in contact with both the end parts of the thermoelectric conversion member 3A. Holding the thermoelectric conversion member 3A between the electrode parts 81 and 81 of the electrode members 8A and 8A, it is possible to electrically connect the electrode members 8A and 8A with the thermoelectric conversion member 3A.

As described above, even when the insulation-side threaded portion of the insulating member 7A is the male threaded portion 72a and the electrode-side threaded portion of the electrode member 8A is the female threaded portion 82a; it is possible to assemble or disassemble the first thermoelectric conversion cell 301 easily by fastening or to loosening the male threaded portion 72a and the female threaded portion 82a.

Figure 21:
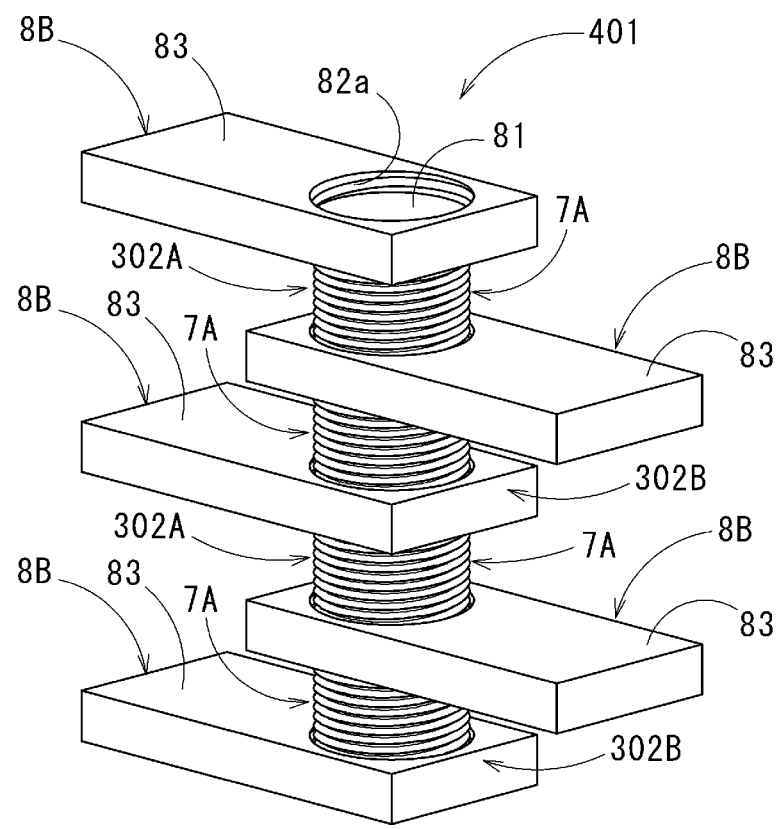
FIG. 21 It is a perspective view showing a thermoelectric conversion module using a thermoelectric conversion cell of a twelfth embodiment according to the present invention.
Figure 22:
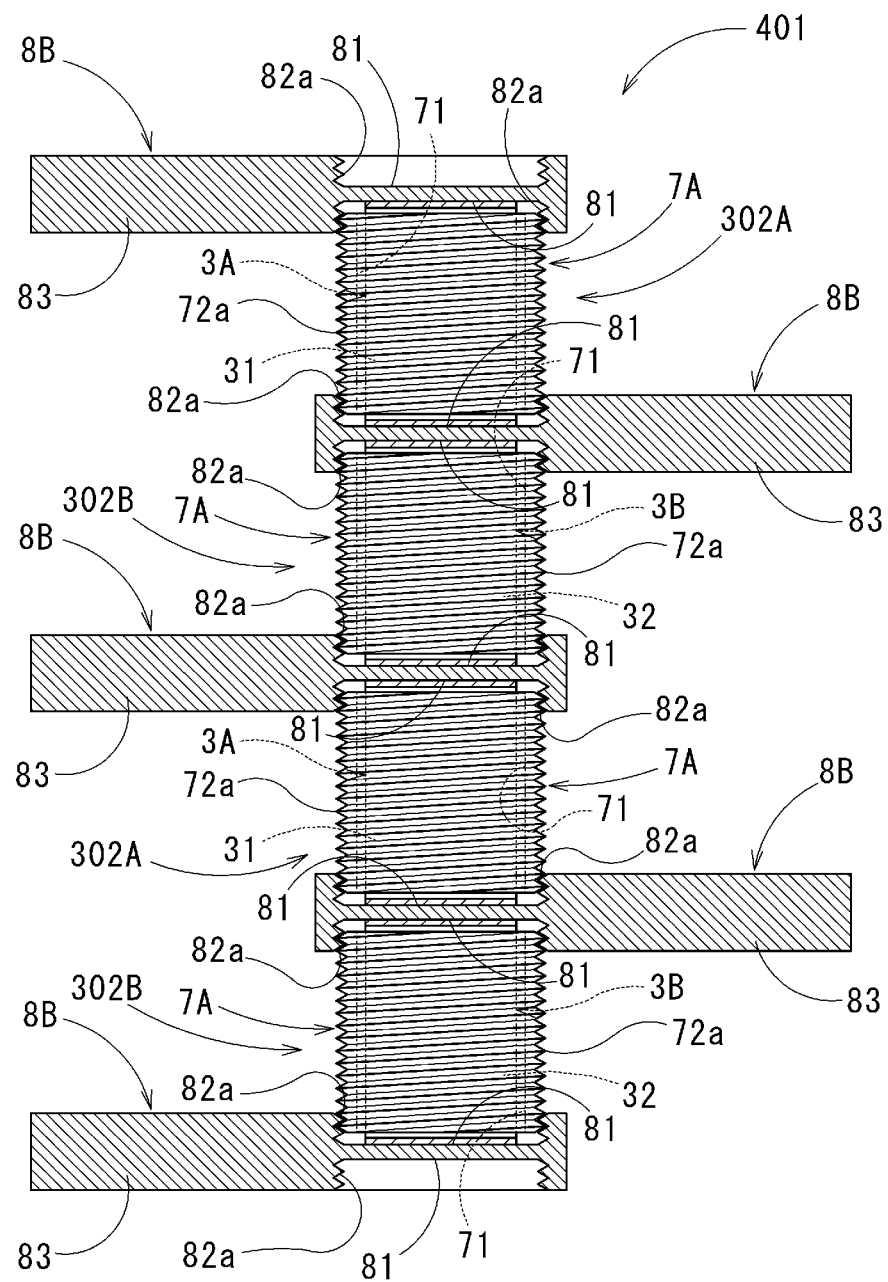
FIG. 22 It is a vertical sectional view of the thermoelectric conversion module shown in FIG. 21.

FIG. 21 and FIG. 22 show a thermoelectric conversion module 401 of a twelfth embodiment. The thermoelectric conversion module 401 has a structure in which the P-type thermoelectric conversion elements 31 and the N-type thermoelectric conversion elements 32 are connected in series by stacking first thermoelectric conversion cells 302A provided with the P-type thermoelectric conversion element 31 (the thermoelectric conversion member 3A) and a second thermoelectric conversion cells 302B provided with the N-type thermoelectric conversion element 32 (the thermoelectric conversion member 3B) alternately in the through-direction of the through hole 71.

In the thermoelectric conversion module 401, the first thermoelectric conversion cells 302A and the second thermoelectric conversion cells 302B are connected with interposing connected-type electrode members 8B fixed to end parts of the respective insulating members 7A. As shown in FIG. 22, the electrode parts 81 and 81 are formed on an upper side and a bottom side in the connected-type electrode members 8B respectively, so as to form a structure in which an electrode member of the first thermoelectric conversion cell 302A and an electrode member of the second thermoelectric conversion cell 302A are formed integrally.

Figure 23:
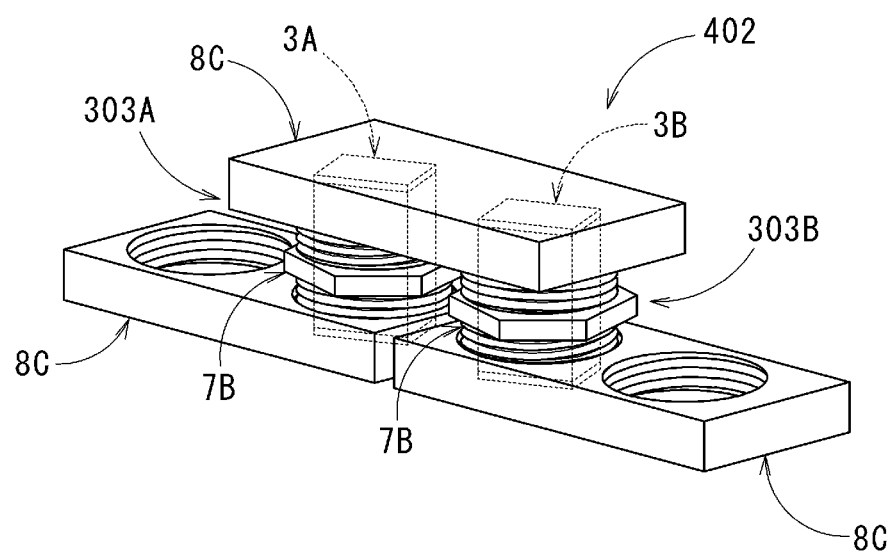
FIG. 23 It is a perspective view of a thermoelectric conversion module using a thermoelectric conversion cell of a thirteenth embodiment according to the present invention.

The female threaded portions 82a corresponding to the male threaded portions 72a are formed on both sides (an upper side and a bottom side) in the connected-type electrode members 8B. By screwing the female threaded portions 82a and the male threaded portions 72a of the insulating members 7A together, the insulating members 7A can be connected to both the sides of the connected-type electrode member 8B respectively, so that the thermoelectric conversion member 3A or 3B can be held between the electrode parts 81 and 81 of one pair of the connected-type electrode members 8B and 8B. As shown in FIG. 23, the insulating members 7A and the connected-type electrode members 8B are connected; so that the first thermoelectric conversion cells 302A and the second thermoelectric conversion cells 302A can be connected to each other by stacking the connected-type electrode members 8B and the thermoelectric conversion member 3A or 3B alternately, so that the thermoelectric conversion module 401 in which the P-type thermoelectric conversion elements 31 and the N-type thermoelectric conversion elements 32 are alternately connected in series can be configured.

A fin 83 used as a high-temperature side fin or a low-temperature side fin is integrally formed on the connected-type electrode members 8B. In the thermoelectric conversion module 401, as shown in FIG. 21 and FIG. 22, the electrode members 8B are arranged so that the fins 83 are extended in a counter direction alternately. As a result, in the thermoelectric conversion module 401, when a left side of FIG. 22 is a high-temperature side and a right side of FIG. 22 is a low-temperature side, electric current flows from the bottom side to the upper side of FIG. 22 so as to generate electricity. In this case, the fins 83 extended out to the left side of FIG. 22 are the high-temperature side fins, and the fins 83 extended out to the right side of FIG. 22 are the low-temperature side fins.

Figure 24:
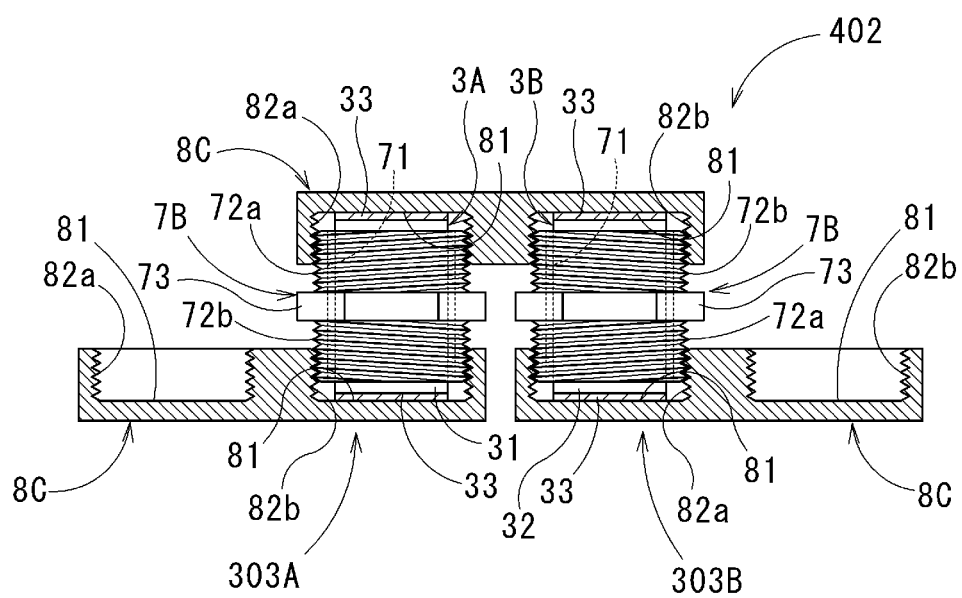
FIG. 24 It is a vertical sectional view of the thermoelectric conversion module shown in FIG. 23.
Figure 25:
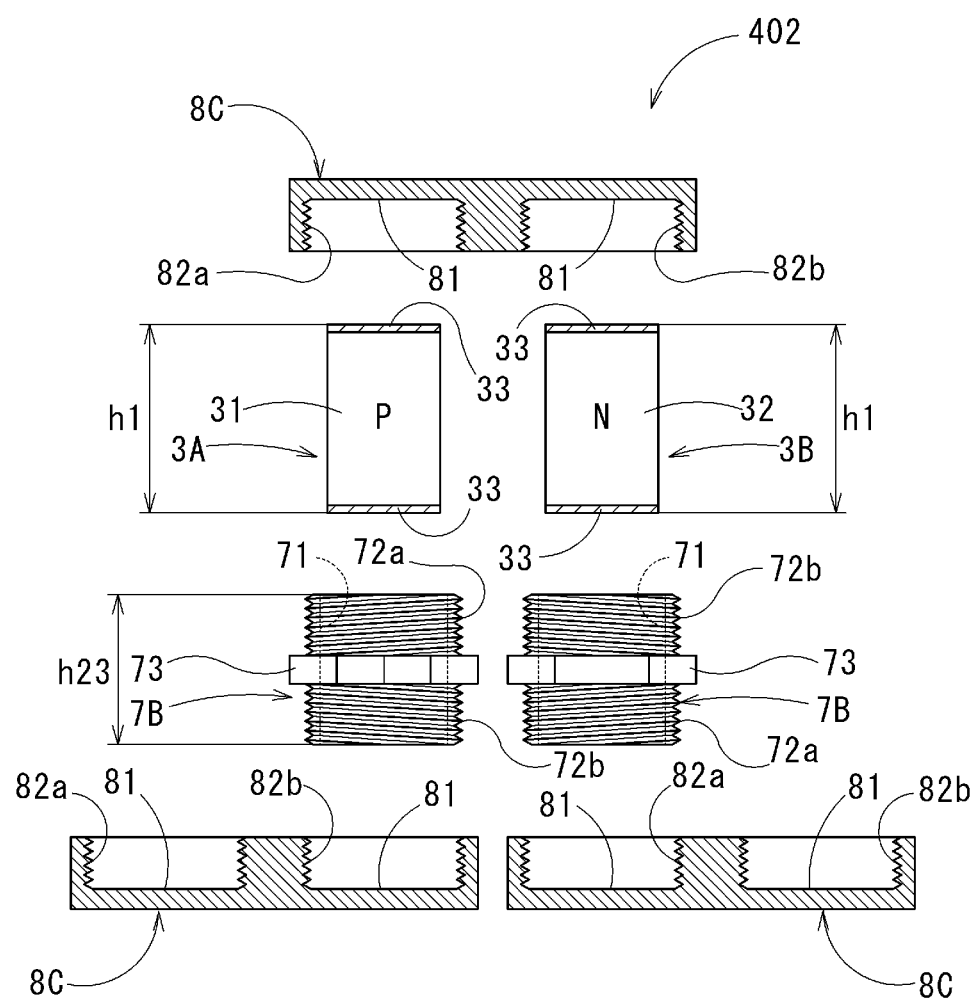
FIG. 25 It is an exploded sectional view of the thermoelectric conversion module shown in FIG. 23.

FIG. 23 to FIG. 25 show a thermoelectric conversion module 402 of a thirteenth embodiment. As shown in FIG. 24, the thermoelectric conversion module 402 has a structure in which the P-type thermoelectric conversion element 31 and the N-type thermoelectric conversion element 32 are connected with a connected-type electrode member 8C by arranging a first thermoelectric conversion cell 303A having the P-type thermoelectric conversion element 31 (the thermoelectric conversion member 3A) and a second thermoelectric conversion cell 303B having the N-type thermoelectric conversion element 32 (the thermoelectric conversion member 3B) in parallel.

Insulating members 7B configuring the thermoelectric conversion module 402 are formed to have a cylindrical shape by forming one through hole 71 inside thereof. Outside the insulating members 7B, a male threaded portion 72a of a right-hand screw and a male threaded portion 72b of a left-hand screw are respectively formed at both end parts of the through hole 71 in the through-direction, and an angular-pillar part 73 of a hexagonal cylinder is formed between the male threaded portion 72a and the male threaded portion 72b. Note that, the insulation-side threaded portion in the present invention is formed by the male threaded portions 72a and 72b.

The connected-type electrode members 8C are formed in a flat-plate shape, and the female threaded portion 82a of the right-hand screw corresponding to the male threaded portion 72a of the right-hand screw and a female threaded portion 82b of the left-hand screw corresponding to the male threaded portion 72b of the left-hand screw are formed one each. Accordingly, it is possible to connect one connected-type electrode member 8C to two insulating members 7B. Note that, the female threaded portions 82a and 82b are the electrode-side threaded portions in the present invention. Two electrode parts 81 are formed on the connected-type electrode members 8C. The electrode parts 81 are provided at a position facing an opening end part of the through hole 71 when the insulating member 7B is connected to the female threaded portions 82a and 82b; that is to say, in a depth side of the female threaded portions 82a and 82b.

As shown in FIG. 25, the insulating members 7B are formed to have a length (a height) h23 along the through-direction thereof that is smaller than the length h1 of the thermoelectric conversion members 3A and 3B. Accordingly, by inserting the thermoelectric conversion member 3A or 3B into the through hole 71 and enclosing it in the through hole 71, the thermoelectric conversion members 3A and 3B can be arranged so as to protrude the end parts of the thermoelectric conversion members 3A and 3B from the through hole 71. The electrode parts 81 can be reliably in contact with the end parts of the thermoelectric conversion members 3A and 3B by connecting both the end parts of the insulating member 7B between the couple of the connected-type electrode members 8C and 8C. Accordingly, it is possible to hold the thermoelectric conversion member 3A between the electrode parts 81 and 81 of the respective connected-type electrode members 8C and 8C; and the connected-type electrode members 8C and 8C and the thermoelectric conversion members 3A and 3B can be electrically connected.

In the thermoelectric conversion module 402, one of the male threaded portions 72a and 72b at both the end parts is the right-hand screw and the other of them is the left-hand screw; the screwing directions of one and the other male threaded portions 72a and 72b are the same in the insulating members 7B. Accordingly, by rotating the insulating member 7B in one direction, it is possible to fasten or loosen the one male threaded portion 72a with the female threaded portion 82a of the connected-type electrode member 8C corresponding to the male threaded portion 72b and the other male threaded portion 72b with the female threaded portion 82b of the connected-type electrode member 8C corresponding to the male threaded portion 72b at once. Therefore it is possible to attach and detach the insulating members 7B and the couple of the connected-type electrode members 8C and 8C connected to both the end parts of the insulating member 7B at once. Moreover, the insulating member 7B can be easily to rotated by holding the angular-pillar part 73 formed between the male threaded portion 72a and the male threaded portion 72b by a wrench or the like, so that it is possible to easily manufacture the thermoelectric conversion module 402 in which the P-type thermoelectric conversion element 31 and the N-type thermoelectric conversion element 32 of the thermoelectric conversion members 3A and 3B are connected in series.

Figure 26:
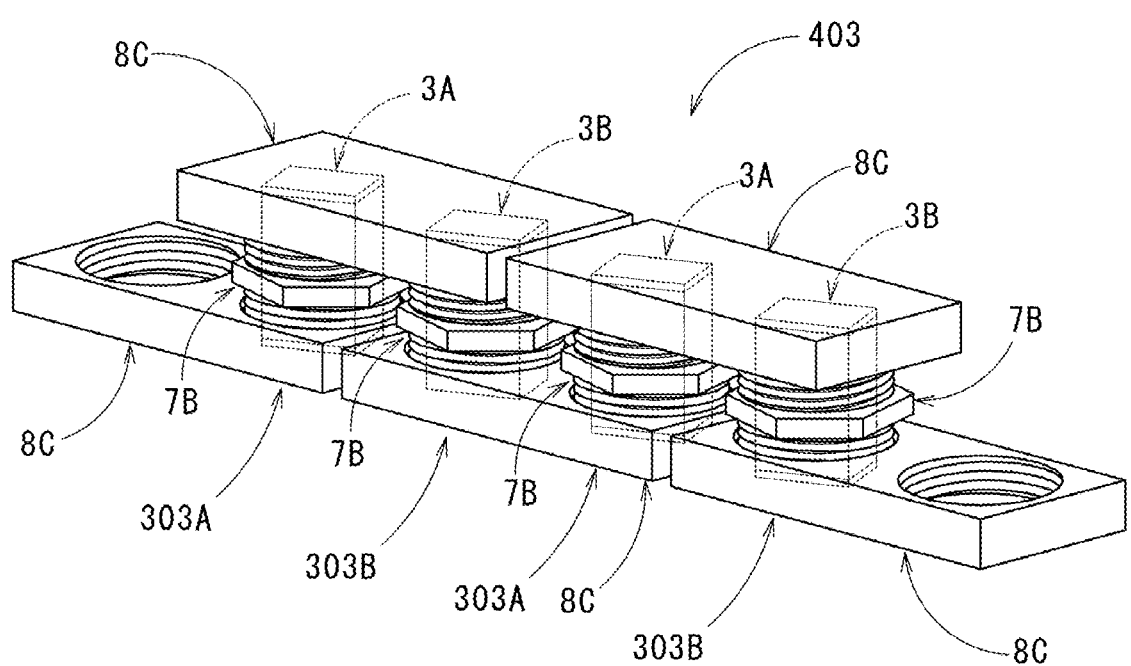
FIG. 26 It is a perspective view showing a thermoelectric conversion module of a fourteenth embodiment according to the present invention.

As in a fourteenth embodiment shown in FIG. 26, a thermoelectric conversion module 403 can also be configured using three or more insulating members 7B. Combining a plurality of the insulating members 7B and the connected-type electrode members 8C, the P-type thermoelectric conversion elements 31 of the thermoelectric conversion members 3A and the N-type thermoelectric conversion elements 32 of the thermoelectric conversion members 3B can be connected alternately in series, and the large-sized thermoelectric conversion module 403 can be easily manufactured.

Figure 27:
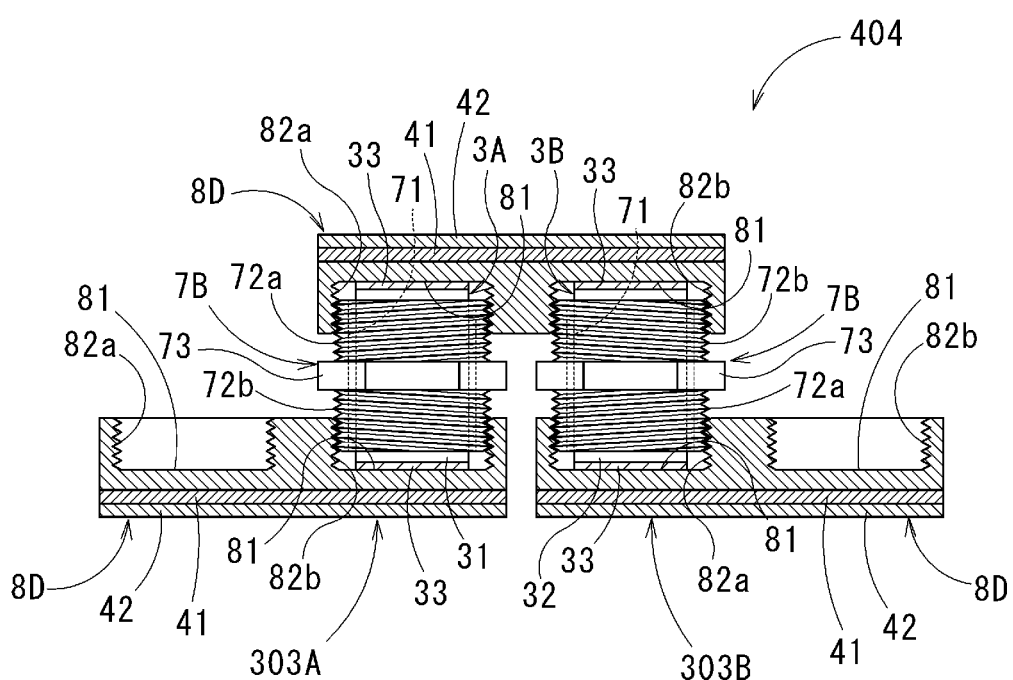
FIG. 27 It is a perspective view showing a thermoelectric conversion module of a fifteenth embodiment according to the present invention.

Moreover, as in a fifteenth embodiment shown in FIG. 27, a thermoelectric conversion module 404 can also be configured using connected-type electrode members 8D having a structure including the ceramic plate 41 and the heat-transfer metal layer 42. Providing the ceramic plate 41 outside the electrode part 81, it is possible to reliably avoid an electric leak between the heat source or the like and the electrode part 81 so as to favorably maintain the insulation state. Furthermore, providing the heat-transfer metal layer 42 on the connected-type electrode ember 8D, the heat-transfer metal layer 42 can be in contact with the heat source or the like, and the thermoelectric conversion module 404 can be in contact more closely with the heat source or the like and it is possible to improve the heat transfer property.

As explained in the above embodiment, in the thermoelectric conversion cell in the present embodiment, the electrode member and the thermoelectric conversion member (the thermoelectric conversion element) are electrically connected by fixing the electrode member to the insulating member so as to hold the thermoelectric conversion member between the electrode parts disposed at both the sides of the through hole. As described above, in the thermoelectric conversion cell of the present embodiment, since the thermoelectric conversion member and the electrode members are electrically connected by holding the thermoelectric conversion member between the electrode parts without bonding to each other, it is possible to prevent the members from breakage owing to difference of thermal expansion between difference metals. Moreover, since the insulating members and the electrode members are provided detachably by screwing of the female threaded portions and the male threaded portions, it is easy to assemble or disassemble. Accordingly, when the thermoelectric conversion members enclosed inside the insulating members are broken or to when the thermoelectric conversion members are need to be replaced in accordance with design changes, the thermoelectric conversion members can be easily replaced and the flexibility of design is improved.

The present invention is not limited to the above-described embodiments and various modification may be made without departing from the scope of the present invention.

For example, angular-pillar elements are used as the thermoelectric conversion elements in the above-described embodiments: however, columnar elements can be used.

INDUSTRIAL APPLICABILITY

It is possible to provide a thermoelectric conversion cell and a thermoelectric conversion module which can prevent breakage owing to difference of thermal expansion between the thermoelectric conversion materials, easily replaceable and being configured from a simple structure.

REFERENCE SIGNS LIST 1A, 1B, 1C, 1D, 1E, 7A, 7B . . . insulating member
2A, 2E, 8A . . . electrode member
2B, 2C, 2D, 2F, 2G, 8B, 8C, 8D . . . connected-type electrode member (electrode member)
3A to 3J . . . thermoelectric conversion member
4 . . . connecting member
5 . . . nut
6A high-temperature side fin
6B low-temperature side fin
11 . . . through hole
12a, 12b . . . female threaded portion (insulation-side threaded portion)
52a . . . female threaded portion
21, 23 . . . head part
22 . . . electrode part
22a, 22b . . . male threaded portion (electrode-side threaded portion)
31, 34A to 34C, 35A, 35B . . . P-type thermoelectric conversion element
32, 36A, 36B . . . N-type thermoelectric conversion element
33 . . . metallized layer
41 . . . ceramic plate
42 . . . heat-transfer metal layer
71 . . . through hole
72a, 72b . . . male threaded portion (insulation-side threaded portion)
73 . . . angular-pillar part
81 . . . electrode part
82a, 82b . . . female threaded portion
83 . . . fin
101A, 101B, 102, 103A, 103B, 104A to 104C, 105, 106, 107A, 107B, 108A, 108B, 109A,
109B, 301, 302A, 302B, 303A, 303B . . . thermoelectric conversion cell
201 to 209, 401 to 404 . . . thermoelectric conversion module

The invention claimed is:

1. A thermoelectric conversion cell comprising:
an insulating member having at least one through hole, and having insulation-side threaded portions at respective end parts of the through hole in a through-direction;
a thermoelectric conversion member having at least one thermoelectric conversion element and enclosed in the through hole; and
an electrode member having electrode-side threaded portions corresponding to the insulation-side threaded portions respectively connected to end parts of the insulating member and an electrode part electrically connected to an end part of the thermoelectric conversion member in the through hole.

2. The thermoelectric conversion cell according to claim 1, wherein
the at least one through hole is one; and
out of the insulation-side threaded portions formed at both the end parts of the insulating member, one is a right-hand screw and the other is a left-hand screw.

3. The thermoelectric conversion cell according to claim 1, wherein
the insulation-side threaded portions are male threaded portions;
the electrode-side threaded portions are female threaded portions; and
the thermoelectric conversion member is formed to be larger than the insulating member in the through-direction of the through hole.

4. The thermoelectric conversion cell according to claim 1, wherein
the insulation-side threaded portions are female threaded portions;
the electrode-side threaded portions are male threaded portions; and
the thermoelectric conversion member is formed smaller than the insulating member in the through-direction of the through hole.

5. The thermoelectric conversion cell according to claim 1 wherein the thermoelectric conversion member has a structure wherein a plurality of the thermoelectric conversion elements each configured from a P-type thermoelectric conversion element or an N-type thermoelectric conversion element are stacked in the through-direction of the through hole, directly or with interposing a conductive member.

6. A thermoelectric conversion module comprising a plurality of the thermoelectric conversion cells according to claim 1, wherein
the thermoelectric conversion cells have a first thermoelectric conversion cell wherein the thermoelectric conversion element is formed from a P-type thermoelectric conversion element and a second thermoelectric conversion cell wherein the thermoelectric conversion element is formed from an N-type thermoelectric conversion element; and
the first thermoelectric conversion cell and the second thermoelectric conversion cell are alternately connected in series.

7. The thermoelectric conversion module according to claim 6, wherein the first thermoelectric conversion cell and the second thermoelectric conversion cell are connected by a connecting member having conductivity.

8. The thermoelectric conversion module according to claim 6, further comprising a connected-type electrode member wherein the electrode member of the first thermoelectric conversion cell and the electrode member of the second thermoelectric conversion cell are integrally formed, wherein
the first thermoelectric conversion cell and the second thermoelectric conversion cell are connected by the connected-type electrode member.

9. The thermoelectric conversion module according to claim 6, wherein
- the first thermoelectric conversion cell and the second thermoelectric conversion cell are alternately stacked in the through-direction; and
- a high-temperature side fin is connected to the electrode member connected to one of the end parts of the thermoelectric conversion cell, and a low-temperature side fin is connected to the electrode member connected to the other of the end parts of the thermoelectric conversion cell.

10. The thermoelectric conversion module according to claim 9, wherein the high-temperature side fin and the low-temperature side fin are formed integrally with the electrode member.

* * * * *